(12) United States Patent
Inagaki et al.

(10) Patent No.: US 10,782,734 B2
(45) Date of Patent: Sep. 22, 2020

(54) ATTACHABLE DEVICE HAVING A FLEXIBLE ELECTRONIC COMPONENT

(71) Applicant: FLEXTERRA, INC., Skokie, IL (US)

(72) Inventors: Philippe Inagaki, Skokie, IL (US); Hjalmar Edzer Ayco Huitema, Belmont, CA (US)

(73) Assignee: FLEXTERRA, INC., Skokie, IL (US)

( * ) Notice: Subject to any disclaimer, the term of this patent is extended or adjusted under 35 U.S.C. 154(b) by 0 days.

(21) Appl. No.: 15/686,653

(22) Filed: Aug. 25, 2017

(65) Prior Publication Data

US 2018/0046214 A1 Feb. 15, 2018

Related U.S. Application Data

(63) Continuation of application No. PCT/US2016/019729, filed on Feb. 26, 2016.
(Continued)

(51) Int. Cl.
| | |
|---|---|
| H05K 5/00 | (2006.01) |
| G06F 1/16 | (2006.01) |
| H01L 51/00 | (2006.01) |
| H05K 5/02 | (2006.01) |
| G06F 3/041 | (2006.01) |

(52) U.S. Cl.
CPC .......... *G06F 1/163* (2013.01); *H01L 51/0097* (2013.01); *H05K 5/0017* (2013.01); *H05K 5/0086* (2013.01); *H05K 5/0217* (2013.01); *H05K 5/0221* (2013.01); *H05K 5/0247* (2013.01); *G06F 3/0412* (2013.01); *G06F 2203/04102* (2013.01); *G09G 2380/02* (2013.01); *H01L 2251/5338* (2013.01); *Y02E 10/549* (2013.01)

(58) Field of Classification Search
CPC ..................................................... G06F 1/1652
See application file for complete search history.

(56) References Cited

U.S. PATENT DOCUMENTS

| | | |
|---|---|---|
| 4,834,376 A | 5/1989 | Steinberg |
| 5,065,376 A | 11/1991 | Choulat |
| (Continued) | | |

FOREIGN PATENT DOCUMENTS

| | | |
|---|---|---|
| CN | 1306636 A | 8/2001 |
| CN | 101180669 A | 5/2008 |
| (Continued) | | |

OTHER PUBLICATIONS

Extended European Search Report for Application No. 14875752.9, dated Aug. 1, 2017.
(Continued)

*Primary Examiner* — Jerry Wu
(74) *Attorney, Agent, or Firm* — Marshall, Gerstein & Borun LLP

(57) ABSTRACT

A dynamically flexible, attachable article, such as a wristband or an armband, includes a flexible electronic component coupled to a flexible support in a manner that is bendable or conformable to a user's wrist or other curved surface in a manner that makes the flexible electronic component easily viewable to the user. The attachable article also includes a connection mechanism disposed proximate to one or both of first and second ends of the attachable article to connect two different portions of the article together.

15 Claims, 18 Drawing Sheets

Related U.S. Application Data

(60) Provisional application No. 62/121,488, filed on Feb. 26, 2015.

(56) References Cited

U.S. PATENT DOCUMENTS

| | | | |
|---|---|---|---|
| 5,162,696 A | 11/1992 | Goodrich | |
| 5,438,488 A | 8/1995 | Dion | |
| 5,438,851 A | 8/1995 | Geissbuhler | |
| 5,644,858 A | 7/1997 | Bemis | |
| 5,707,745 A | 1/1998 | Forrest et al. | |
| 5,844,363 A | 12/1998 | Gu et al. | |
| 5,889,737 A | 3/1999 | Alameh et al. | |
| 5,930,026 A | 7/1999 | Jacobson et al. | |
| 5,930,921 A | 8/1999 | Sorofman et al. | |
| 5,931,764 A | 8/1999 | Freeman et al. | |
| 6,011,309 A | 1/2000 | Ahn | |
| 6,097,147 A | 8/2000 | Baldo et al. | |
| 6,134,965 A | 10/2000 | Somville | |
| 6,196,932 B1 | 3/2001 | Marsh et al. | |
| 6,212,133 B1 | 4/2001 | McCoy et al. | |
| 6,303,238 B1 | 10/2001 | Thompson et al. | |
| 6,369,865 B2 | 4/2002 | Hinata | |
| 6,503,188 B1 | 1/2003 | August | |
| 6,577,496 B1 | 6/2003 | Gioscia et al. | |
| 6,585,914 B2 | 7/2003 | Marks et al. | |
| 6,608,323 B2 | 8/2003 | Marks et al. | |
| 6,619,835 B2 | 9/2003 | Kita | |
| 6,750,607 B2 | 6/2004 | Huitema et al. | |
| 6,831,769 B2 | 12/2004 | Holman et al. | |
| 6,837,590 B2 | 1/2005 | Marston | |
| 6,839,158 B2 | 1/2005 | Albert et al. | |
| 6,991,749 B2 | 1/2006 | Marks et al. | |
| 7,170,670 B2 | 1/2007 | Webber | |
| 7,180,665 B2 | 2/2007 | Daniel et al. | |
| 7,209,114 B2 | 4/2007 | Radley-Smith | |
| 7,278,093 B2 | 10/2007 | Jablonski et al. | |
| 7,374,702 B2 | 5/2008 | Marks et al. | |
| 7,384,814 B2 | 6/2008 | Huitema et al. | |
| 7,446,945 B2 | 11/2008 | Kuiper et al. | |
| 7,453,452 B2 | 11/2008 | Huitema et al. | |
| 7,528,176 B2 | 5/2009 | Marks et al. | |
| 7,564,436 B2 | 7/2009 | Huitema et al. | |
| 7,569,693 B2 | 8/2009 | Marks et al. | |
| 7,605,225 B2 | 10/2009 | Marks et al. | |
| 7,618,260 B2 | 11/2009 | Daniel et al. | |
| 7,667,962 B2 | 2/2010 | Mullen | |
| 7,671,202 B2 | 3/2010 | Marks et al. | |
| 7,710,370 B2 | 5/2010 | Slikkerveer et al. | |
| 7,714,801 B2 | 5/2010 | Kimmel | |
| 7,755,605 B2 | 7/2010 | Daniel et al. | |
| 7,786,951 B2 | 8/2010 | Huitema et al. | |
| 7,787,097 B2 | 8/2010 | Satoh | |
| 7,787,917 B2 | 8/2010 | Aoki et al. | |
| 7,816,480 B2 | 10/2010 | Marks et al. | |
| 7,842,198 B2 | 11/2010 | Marks et al. | |
| 7,892,454 B2 | 2/2011 | Facchetti et al. | |
| 7,893,265 B2 | 2/2011 | Facchetti et al. | |
| 7,902,363 B2 | 3/2011 | Facchetti et al. | |
| 7,947,837 B2 | 5/2011 | Marks et al. | |
| 7,956,820 B2 | 6/2011 | Huitema et al. | |
| 7,965,258 B2 | 6/2011 | Aoki | |
| 7,982,039 B2 | 7/2011 | Marks et al. | |
| 8,017,458 B2 | 9/2011 | Marks et al. | |
| 8,022,214 B2 | 9/2011 | Facchetti et al. | |
| 8,077,283 B2 | 12/2011 | Van Veenendaal et al. | |
| 8,097,877 B2 | 1/2012 | Marks et al. | |
| 8,111,465 B2 | 2/2012 | Heikenfeld et al. | |
| 8,117,903 B2 | 2/2012 | Golden et al. | |
| 8,125,434 B2 | 2/2012 | Huitema et al. | |
| 8,151,501 B2 | 4/2012 | Bemelmans et al. | |
| 8,196,267 B2 | 6/2012 | Nalley et al. | |
| 8,199,471 B2 | 6/2012 | Bemelmans et al. | |
| 8,237,909 B2 | 8/2012 | Ostreko et al. | |
| 8,279,166 B2 | 10/2012 | Huitema et al. | |
| 8,325,143 B2 | 12/2012 | Destura et al. | |
| 8,329,855 B2 | 12/2012 | Usta et al. | |
| 8,334,545 B2 | 12/2012 | Levermore et al. | |
| 8,358,275 B2 | 1/2013 | Huitema | |
| 8,380,327 B2 | 2/2013 | Park | |
| 8,395,150 B2 | 3/2013 | Marks et al. | |
| 8,404,844 B2 | 3/2013 | Kastler et al. | |
| 8,414,411 B2 | 4/2013 | Stites et al. | |
| 8,440,828 B2 | 5/2013 | Quinn et al. | |
| 8,446,549 B2 | 5/2013 | Huitema et al. | |
| 8,466,851 B2 | 6/2013 | Huitema et al. | |
| D686,217 S | 7/2013 | Andre | |
| 8,474,146 B2 | 7/2013 | Hartford et al. | |
| 8,477,250 B2 | 7/2013 | Schellingerhout et al. | |
| 8,482,909 B2 | 7/2013 | Douglas | |
| 8,493,714 B2 | 7/2013 | Visser et al. | |
| 8,502,788 B2 | 8/2013 | Cho | |
| 8,508,468 B2 | 8/2013 | Huitema | |
| 8,508,920 B2 | 8/2013 | Huitema et al. | |
| 8,514,213 B2 | 8/2013 | van Veenendaal et al. | |
| 8,536,579 B2 | 9/2013 | Sele et al. | |
| 8,537,104 B2 | 9/2013 | Markvoort et al. | |
| 8,547,293 B2 | 10/2013 | Van Lieshout et al. | |
| 8,547,325 B2 | 10/2013 | Huitema | |
| 8,618,448 B2 | 12/2013 | Alexander | |
| 9,030,419 B1 | 5/2015 | Freed | |
| 9,176,530 B2 | 11/2015 | Rothkopf et al. | |
| 9,223,494 B1 | 12/2015 | DeSalvo et al. | |
| 9,510,470 B2 | 11/2016 | Huitema et al. | |
| 9,560,751 B2 | 1/2017 | Huitema et al. | |
| 9,629,120 B2 | 4/2017 | Ryu et al. | |
| 9,642,241 B2 | 5/2017 | Huitema et al. | |
| 2001/0004808 A1 | 6/2001 | Hurwitz | |
| 2002/0019296 A1 | 2/2002 | Freeman et al. | |
| 2002/0027634 A1 | 3/2002 | Kang et al. | |
| 2002/0070926 A1 | 6/2002 | Kavanagh | |
| 2003/0030595 A1* | 2/2003 | Radley-Smith | A44C 5/0007 345/1.3 |
| 2003/0046849 A1 | 3/2003 | Lin | |
| 2003/0182924 A1 | 10/2003 | Tsutsumi et al. | |
| 2003/0197597 A1 | 10/2003 | Bahl et al. | |
| 2004/0052044 A1 | 3/2004 | Mochizuki et al. | |
| 2004/0189605 A1 | 9/2004 | Shih | |
| 2004/0212968 A1 | 10/2004 | Lin | |
| 2004/0266496 A1 | 12/2004 | Kauhaniemi et al. | |
| 2005/0110785 A1 | 5/2005 | Ochiai et al. | |
| 2006/0020469 A1 | 1/2006 | Rast | |
| 2006/0055691 A1 | 3/2006 | Bursett | |
| 2006/0077127 A1 | 4/2006 | Sampsell et al. | |
| 2006/0096392 A1 | 5/2006 | Inkster et al. | |
| 2006/0132025 A1 | 6/2006 | Gao et al. | |
| 2006/0202618 A1 | 9/2006 | Ishii et al. | |
| 2006/0204675 A1 | 9/2006 | Gao et al. | |
| 2006/0209218 A1 | 9/2006 | Lee et al. | |
| 2006/0238494 A1 | 10/2006 | Narayanaswami et al. | |
| 2006/0262098 A1 | 11/2006 | Okamoto | |
| 2006/0273304 A1 | 12/2006 | Cok | |
| 2007/0090420 A1 | 4/2007 | Chu et al. | |
| 2007/0117600 A1 | 5/2007 | Robertson et al. | |
| 2007/0120813 A1 | 5/2007 | Huitema et al. | |
| 2007/0195067 A1 | 8/2007 | Zotov et al. | |
| 2007/0205997 A1 | 9/2007 | Lieshout et al. | |
| 2007/0228952 A1 | 10/2007 | Kwon et al. | |
| 2007/0279852 A1 | 12/2007 | Daniel et al. | |
| 2008/0018631 A1 | 1/2008 | Hioki et al. | |
| 2008/0037374 A1 | 2/2008 | Chu et al. | |
| 2008/0094314 A1 | 4/2008 | Huitema et al. | |
| 2008/0094322 A1 | 4/2008 | Sarma et al. | |
| 2008/0100636 A1 | 5/2008 | Lai et al. | |
| 2008/0150928 A1 | 6/2008 | Van Der Hoef et al. | |
| 2008/0198184 A1 | 8/2008 | Schellingerhout et al. | |
| 2008/0204367 A1 | 8/2008 | Lafarre et al. | |
| 2008/0212271 A1 | 9/2008 | Misawa | |
| 2008/0218369 A1 | 9/2008 | Krans et al. | |
| 2008/0223708 A1 | 9/2008 | Joo | |
| 2008/0223746 A1 | 9/2008 | Van Rens et al. | |
| 2008/0248838 A1 | 10/2008 | Chiang | |
| 2008/0278472 A1 | 11/2008 | Huitema et al. | |
| 2008/0291225 A1 | 11/2008 | Arneson | |
| 2008/0316580 A1 | 12/2008 | Gillies et al. | |

(56) References Cited

U.S. PATENT DOCUMENTS

| | | |
|---|---|---|
| 2009/0067123 A1 | 3/2009 | Huitema et al. |
| 2009/0122007 A1 | 5/2009 | Tsuzaki et al. |
| 2009/0189878 A1 | 7/2009 | Goertz et al. |
| 2009/0197749 A1 | 8/2009 | Merkel et al. |
| 2009/0219225 A1 | 9/2009 | Cope |
| 2009/0251888 A1 | 10/2009 | Douglas |
| 2009/0267969 A1 | 10/2009 | Sakamoto |
| 2009/0290117 A1 | 11/2009 | Watanabe et al. |
| 2009/0296249 A1 | 12/2009 | van Lieshout et al. |
| 2010/0033435 A1 | 2/2010 | Huitema |
| 2010/0045705 A1 | 2/2010 | Vertegaal et al. |
| 2010/0050133 A1 | 2/2010 | Nishihara et al. |
| 2010/0117975 A1 | 5/2010 | Cho |
| 2010/0127965 A1 | 5/2010 | Park |
| 2010/0156868 A1 | 6/2010 | Hirayama |
| 2010/0164973 A1 | 7/2010 | Huitema et al. |
| 2010/0194785 A1 | 8/2010 | Huitema et al. |
| 2010/0231544 A1 | 9/2010 | Lu et al. |
| 2010/0238098 A1 | 9/2010 | Watanabe |
| 2010/0238612 A1 | 9/2010 | Hsiao et al. |
| 2010/0252112 A1 | 10/2010 | Watson |
| 2010/0259524 A1 | 10/2010 | Markvoort et al. |
| 2010/0283047 A1 | 11/2010 | Facchetti et al. |
| 2010/0295761 A1 | 11/2010 | van Lieshout et al. |
| 2010/0315225 A1 | 12/2010 | Teague |
| 2010/0320448 A1 | 12/2010 | Sele et al. |
| 2010/0326527 A1 | 12/2010 | Facchetti et al. |
| 2011/0003665 A1 | 1/2011 | Burton et al. |
| 2011/0043976 A1 | 2/2011 | Visser et al. |
| 2011/0048619 A1 | 3/2011 | Meinders et al. |
| 2011/0090155 A1 | 4/2011 | Caskey et al. |
| 2011/0109654 A1 | 5/2011 | Van Veenendaal et al. |
| 2011/0120558 A1 | 5/2011 | Facchetti et al. |
| 2011/0122593 A1 | 5/2011 | Van Lieshout et al. |
| 2011/0124375 A1 | 5/2011 | Stuivenwold |
| 2011/0128260 A1 | 6/2011 | Huitema et al. |
| 2011/0128266 A1 | 6/2011 | Chiu et al. |
| 2011/0136333 A1 | 6/2011 | Facchetti et al. |
| 2011/0148797 A1 | 6/2011 | Huitema et al. |
| 2011/0157046 A1 | 6/2011 | Lee et al. |
| 2011/0185612 A1 | 8/2011 | Waggoner |
| 2011/0187681 A1 | 8/2011 | Kim et al. |
| 2011/0227080 A1 | 9/2011 | Roh et al. |
| 2011/0227855 A1 | 9/2011 | Kim et al. |
| 2011/0256649 A1 | 10/2011 | Huitema et al. |
| 2011/0279418 A1 | 11/2011 | Han et al. |
| 2011/0279442 A1 | 11/2011 | Hage et al. |
| 2011/0310035 A1 | 12/2011 | Kim et al. |
| 2012/0007796 A1 | 1/2012 | Jokinen et al. |
| 2012/0038861 A1 | 2/2012 | van Lieshout et al. |
| 2012/0080462 A1 | 4/2012 | Hajarian |
| 2012/0083705 A1 | 4/2012 | Yuen et al. |
| 2012/0086691 A1 | 4/2012 | van Lieshout et al. |
| 2012/0105333 A1 | 5/2012 | Maschmeyer et al. |
| 2012/0122519 A1 | 5/2012 | Jochheim |
| 2012/0162088 A1 | 6/2012 | van Lieshout et al. |
| 2012/0162876 A1 | 6/2012 | Kim |
| 2012/0182282 A1 | 7/2012 | van Veenendaal et al. |
| 2012/0182755 A1 | 7/2012 | Wildner |
| 2012/0188750 A1 | 7/2012 | Marston |
| 2012/0194448 A1 | 8/2012 | Roth Kopf |
| 2012/0194478 A1 | 8/2012 | Liu et al. |
| 2012/0212433 A1 | 8/2012 | Lee et al. |
| 2012/0223314 A1 | 9/2012 | Marks et al. |
| 2012/0242599 A1 | 9/2012 | Seo et al. |
| 2012/0264489 A1 | 10/2012 | Choi et al. |
| 2012/0283799 A1 | 11/2012 | Fan |
| 2012/0314546 A1 | 12/2012 | Brewer et al. |
| 2012/0327048 A1 | 12/2012 | Ramrattan et al. |
| 2013/0005404 A1 | 1/2013 | Bremer |
| 2013/0010405 A1 | 1/2013 | Rothkopf et al. |
| 2013/0025647 A1 | 1/2013 | Bouten et al. |
| 2013/0027853 A1 | 1/2013 | Chen et al. |
| 2013/0038622 A1 | 2/2013 | Yang |
| 2013/0044215 A1 | 2/2013 | Rothkopf et al. |
| 2013/0054997 A1 | 2/2013 | Wyatt et al. |
| 2013/0058063 A1 | 3/2013 | O'Brien |
| 2013/0062598 A1 | 3/2013 | Usta et al. |
| 2013/0070431 A1 | 3/2013 | Fukuma et al. |
| 2013/0076612 A1 | 3/2013 | Myers |
| 2013/0076649 A1 | 3/2013 | Myers et al. |
| 2013/0083496 A1 | 4/2013 | Franklin et al. |
| 2013/0106603 A1 | 5/2013 | Weast et al. |
| 2013/0113761 A1 | 5/2013 | van Lieshout et al. |
| 2013/0120106 A1 | 5/2013 | Cauwels et al. |
| 2013/0127690 A1 | 5/2013 | Tsai |
| 2013/0127748 A1 | 5/2013 | Vertegaal et al. |
| 2013/0127765 A1 | 5/2013 | Behdasht et al. |
| 2013/0128439 A1 | 5/2013 | Walters et al. |
| 2013/0131887 A1 | 5/2013 | Park |
| 2013/0141405 A1 | 6/2013 | Huitema et al. |
| 2013/0145522 A1 | 6/2013 | da Silva |
| 2013/0145795 A1 | 6/2013 | Asami |
| 2013/0154826 A1 | 6/2013 | Ratajczyk |
| 2013/0172068 A1 | 7/2013 | Zhou et al. |
| 2013/0182382 A1 | 7/2013 | Vardi et al. |
| 2013/0191741 A1 | 7/2013 | Dickinson et al. |
| 2013/0197680 A1 | 8/2013 | Cobbett et al. |
| 2013/0219332 A1 | 8/2013 | Woley et al. |
| 2013/0222208 A1 | 8/2013 | Gorilovsky et al. |
| 2013/0222270 A1 | 8/2013 | Winkler et al. |
| 2013/0222271 A1 | 8/2013 | Alberth et al. |
| 2013/0229373 A1 | 9/2013 | Eriksson et al. |
| 2013/0235008 A1 | 9/2013 | Kwon |
| 2013/0265257 A1 | 10/2013 | Jung et al. |
| 2013/0286466 A1 | 10/2013 | Lieshout et al. |
| 2013/0300779 A1 | 11/2013 | Van Baarsen et al. |
| 2013/0326790 A1 | 12/2013 | Cauwels et al. |
| 2013/0335929 A1 | 12/2013 | Cavallaro |
| 2014/0042406 A1 | 2/2014 | Degner et al. |
| 2014/0049487 A1 | 2/2014 | Konertz et al. |
| 2014/0062892 A1 | 3/2014 | Dickinson et al. |
| 2014/0123015 A1 | 5/2014 | Sako et al. |
| 2014/0123436 A1 | 5/2014 | Griffin et al. |
| 2014/0138637 A1 | 5/2014 | Yang et al. |
| 2014/0226275 A1 | 8/2014 | Ko et al. |
| 2014/0257050 A1 | 9/2014 | Kuroda et al. |
| 2015/0020081 A1 | 1/2015 | Cho et al. |
| 2015/0084892 A1 | 3/2015 | Shirota et al. |
| 2015/0089974 A1 | 4/2015 | Seo et al. |
| 2015/0124566 A1 | 5/2015 | Lake et al. |
| 2015/0131222 A1* | 5/2015 | Kauhaniemi .......... G06F 1/1652 361/679.27 |
| 2015/0162751 A1 | 6/2015 | Leabman et al. |
| 2015/0169011 A1 | 6/2015 | Bibl et al. |
| 2015/0185766 A1 | 7/2015 | Otsuka et al. |
| 2015/0185944 A1 | 7/2015 | Magi et al. |
| 2015/0227245 A1 | 8/2015 | Inagaki et al. |
| 2015/0333572 A1 | 11/2015 | Leabman |
| 2015/0334069 A1 | 11/2015 | Winston et al. |
| 2015/0378391 A1 | 12/2015 | Huitema et al. |
| 2015/0381793 A1 | 12/2015 | Cerda et al. |
| 2016/0014919 A1 | 1/2016 | Huitema et al. |
| 2016/0019703 A1 | 1/2016 | Tian |
| 2016/0034742 A1 | 2/2016 | Kim et al. |
| 2016/0037625 A1 | 2/2016 | Huitema et al. |
| 2016/0041581 A1 | 2/2016 | Piccionelli et al. |
| 2016/0041680 A1 | 2/2016 | Chi et al. |
| 2016/0062410 A1 | 3/2016 | Ko et al. |
| 2016/0142863 A1 | 5/2016 | Lam |
| 2016/0212837 A1 | 7/2016 | Kim |
| 2016/0277891 A1 | 9/2016 | Dvortsov et al. |
| 2016/0283086 A1 | 9/2016 | Inagaki et al. |
| 2016/0299570 A1 | 10/2016 | Davydov |
| 2016/0322745 A1 | 11/2016 | Shedletsky et al. |
| 2016/0360618 A1 | 12/2016 | Elsherbini et al. |
| 2016/0379205 A1 | 12/2016 | Margadoudakis |
| 2017/0046931 A1 | 2/2017 | Hartweg et al. |
| 2017/0052749 A1 | 2/2017 | Lee |

(56) References Cited

U.S. PATENT DOCUMENTS

| | | | |
|---|---|---|---|
| 2017/0235341 A1 | 8/2017 | Huitema et al. |
| 2017/0236497 A1 | 8/2017 | Huitema et al. |

FOREIGN PATENT DOCUMENTS

| | | | |
|---|---|---|---|
| CN | 101180864 A | 5/2008 |
| CN | 101796563 A | 8/2010 |
| CN | 102486906 A | 6/2012 |
| CN | 103021277 A | 4/2013 |
| DE | 202006012076 U1 | 10/2006 |
| EP | 1599110 A1 | 11/2005 |
| EP | 2551110 A1 | 1/2013 |
| FR | 2284149 A1 | 4/1976 |
| JP | 2002-278466 A | 9/2002 |
| JP | 2003-299238 A | 10/2003 |
| JP | 2008-026710 A | 2/2008 |
| JP | 2009-110780 A | 5/2009 |
| JP | 2009-170173 A | 7/2009 |
| JP | 2010-072380 A | 4/2010 |
| JP | 2010-159803 A | 7/2010 |
| JP | 2010-204377 A | 9/2010 |
| JP | 2013044293 A | 3/2013 |
| JP | 2013044294 A | 3/2013 |
| JP | 2013068292 A | 4/2013 |
| JP | 60-89448 B2 | 3/2017 |
| KR | 2011-0008118 U | 8/2011 |
| KR | 1256109 | 4/2013 |
| KR | 1278604 | 6/2013 |
| KR | 1301561 | 9/2013 |
| KR | 20150035232 A | 4/2015 |
| TW | 504127 U | 9/2002 |
| TW | M258364 U | 3/2005 |
| TW | M265636 U | 5/2005 |
| TW | 200815886 A | 4/2008 |
| TW | 201035934 A | 10/2010 |
| TW | 1383343 B | 1/2013 |
| TW | 201301002 A | 1/2013 |
| WO | WO-00/25193 A2 | 5/2000 |
| WO | WO-01/64070 A1 | 9/2001 |
| WO | WO-2004/047059 A1 | 6/2004 |
| WO | WO-2006/027727 A1 | 3/2006 |
| WO | WO-2006/085271 A2 | 8/2006 |
| WO | WO-2006/090434 A1 | 8/2006 |
| WO | WO-2007/023406 A2 | 3/2007 |
| WO | WO-2007/042987 A1 | 4/2007 |
| WO | WO-2008/054206 A2 | 5/2008 |
| WO | WO-2012/156804 A1 | 11/2012 |
| WO | WO-2012/167204 A2 | 12/2012 |
| WO | WO-2013/138003 A1 | 9/2013 |
| WO | WO-2015/023804 A1 | 2/2015 |

OTHER PUBLICATIONS

Office Action for Taiwanese Application No. 103129521, dated Apr. 9, 2018.
First Office Action received in corresponding Chinese Application No. 2014/180076308.2 dated Jun. 29, 2018.
First Office Action received in corresponding Chinese Application No. 2014/80076314.8 dated Jun. 28, 2018.
European Office Action for Application No. 14875752.9, dated Sep. 19, 2018.
First Office Action received in corresponding Chinese Application No. 2014/80076264.3 dated May 28, 2018.
Notice of Reasons for Rejection for Japanese Application No. 2016-543044, dated Oct. 30, 2018.
Office Action for Taiwanese Application No. 103145225, dated Jan. 7, 2019.
Office Action for Taiwanese Application No. 103145253, dated Aug. 2, 2018.
Second Chinese Office Action for Application No. 201480058291.8, dated Jun. 1, 2018.
Third Chinese Office Action for Application No. 201480058291.8, dated Jan. 14, 2019.
Notice of Reasons for Rejection for Japanese Application No. 2016-542913, dated Feb. 27, 2019.
European Office Action for Application No. 14874426.1, dated Mar. 7, 2019.
Second Chinese Office Action for Application No. 201480076314.8, dated Mar. 11, 2019.
Second Chinese Office Action for Application No. 201480076308.2, dated Mar. 11, 2019.
Office Action for Taiwanese Application No. 103145254, dated Mar. 18, 2019.
European Office Action for Application No. 14875486.4, dated Apr. 25, 2019.
First Chinese Office Action for Application No. 201480056371.X, dated Apr. 3, 2019.
Office Action for Taiwanese Application No. 103127788, dated Mar. 7, 2019.
European Office Action for Application No. 14875486.4, dated Mar. 25, 2020.
European Office Action for Application No. 14875752.9, dated Mar. 25, 2020.
Notice of Final Rejection for Japanese Application No. 2016-542913, dated Oct. 29, 2019.
Notice of Reasons for Rejection for Japanese Application No. 2016-543044, dated May 29, 2019.
Office Action for Taiwanese Application No. 104109785, dated Jul. 12, 2019.
"3M Flexible Transparent Touchscreen Concepts" video located on the Internet at <http://www.youtube.com/watch?v=kCZz4jFok_o> (uploaded Jan. 6, 2011).
"Amazin Concept Holo Computer Elodie Delassus", Art, Concepts, Design, Gadgets, downloaded from the Internet at: <http://designskings.com/amazin-concept-holo-computer-elodie-delassus/> (Jan. 18, 2012).
"Athletics and their supporters", Enlightened®: Illuminated Clothing by Janet Hansen, downloaded from the Internet at <http://enlighted.com/pages/athletics.shtml> (Aug. 8, 2013).
"E-Clock", Tokyoflash Japn Product Design Studio, downloaded from the Internet at <http://blog.tokyoflash.com/2010/03/e-clock/> (Mar. 10, 2010).
"Features", SEG Sports Entertainment Gear, downloaded from the Internet at <http://www.segshirts.com/features> (Aug. 8, 2013).
"Flex Mobile, a Flexible Phone That Becomes a Bracelet, Some Other Wearable Piece of Gear", Concept Phones, downloaded from the Internet at <http://www.concept-phones.com/tag/carolina-rebelo/> (Apr. 19, 2011).
"Flexible Smart Phone Fluid Presented by Philips", YouTube, downloaded from the Internet at <http://www.youtube.com/watch?v-Wq9montNgbM&feature=player_detailpage> (Apr. 2, 2012).
"IPING Putter App Cradle Attachment Case for iPhone 5", Carlsbad Golf Center, downloaded from the Internet at <https://www.cgcgolfshop.com/p-50-iping-putter-app-cradle-attachment-case-for-iphone-5.aspx> (Aug. 8, 2013).
"Moment Smartwatch: World's First Wrap Around Smart Watch," Momentum Labs LLC, 28 pp. (Jun. 24, 2014).
"OutEDGE iPhone 5 External 2800 mAH Battery Extender Case w/ Flip Screen Cover", outEDGEPOWER Products, downloaded from the Internet at <http://www.outedgepower.com/outedge-iphone-5-external-2800-mah-battery-extender-case-w-flip-screen-cover/> (Aug. 8, 2013).
"Philips unveils world's first 'Rollable Display' pocket e-Reader concept READIUS", PHYS.org website(Sep. 1, 2005).
"Rohm shows a flexible-OLED wristband", OLED-Info.com, downloaded from the Internet at <http://www.oled-info.com/rohm-shows-flexible-oled-wristband> (Oct. 5, 2009).
"Samsung concept video for wearables and phones", YouTube screenshot, downloaded from the Internet at <http://www.youtube.com/watch?v=ezriwGwJGOs> (Jul. 15, 2013).
"Samsung Galaxy X Concept Packs the Same Specs of teh Galaxy S II Plus a 12 MP Camera", Concept Phones website (May 15, 2011).
"Samsung Smart Watch Trademarks Filed, Wearable Internet Nearing Debut", Fox News Latino, downloaded from the Internet at

(56) References Cited

OTHER PUBLICATIONS

<http://latino.foxnews.com/latino/money/2013/08/07/samsung-smart-watch-trademarks-filed-wearable-internet-nearing-debut/> (Aug. 7, 2013).
"Sony Smartwatch 2 goes official: water-resistant, open API", phoneArena.com, downloaded from the Internet at <http://www.phonearena.com/news/Sony-Smartwatch-2-goes-official-water-resistant-open-API_id44469> (Jun. 25, 2013).
"Taiwan Company to Begin Production of Large Format Flexible Electronic Paper Display Technology", Over the Wire, downloaded from the Internet at <http://www.naylornetwork.com/ppi-otw/articles/?aid=219054&issueID=29119> (Aug. 8, 2013).
"Thermal Image Athletic Apparel", Trendhunter Lifestyle, downloaded from the Internet at <http://www.trendhunter.com/trends/high-tech-athletic-apparel> (Mar. 16, 2013).
"Wearable Concept Phone is Not Nokia 888", Concept Phones, downloaded from the Internet at <http://www.concept-phones.com/tag/hyun-sung-lee/> (Jul. 18, 2008).
"What Will You Pop?", popSLATE, downloaded from the Internet at <http://www.popslate.com> (2012).
"Yuno Concept", TechPin, downloaded from the Internet at <http://www.techpin.com/yuno-concept/> (May 8, 2008).
Catacchio, "New Oled panel to bring bendable cell phones closer to reality?", TNW, downloaded from the Internet at <http://thenextweb.com/asia/2010/10/04/new-oled-panel-to-bring-bendable-cell-phones-closer-to-reality/> (Oct. 4, 2010).
Cochrane et al., "Flexible displays for smart clothing: Part I—Overview", Indian Journal of Fibre & Textile Research, 36:422-8 (Dec. 2011).
Cooper, "Hands-on with Polymer Vision's e-ink Readius", engadget, downloaded from the Internet at <http://www.engadget.com/2008/02/14/hands-on-with-polymer-visions-e-ink-readius/> (Feb. 14, 2008).
Crisp, "Rafael Nadal demonstrates Babolat Play & Connect interactive tennis racquet", gizmag, downloaded from the Internet at <http://www.gizmag.com/rafael-nadal-demonstrates-babolat-play--connect-interactive-tennis-racquet/22699/> (May 26, 2012).
Eaton, "Nokia Morph Cellphone Rolls Up, Stretches, Cleans Itself", GIZMODO, downloaded from the Internet at <http://gizmodo.com/360260/nokia-morph-cellphone-rolls-up-stretches-cleans-itself> (Feb. 25, 2008).
Extended European Search Report for Application No. 14874426.1, dated Aug. 11, 2017.
Extended European Search Report for Application No. 14875486.4, dated Sep. 19, 2017.
Fingas, "Tentative Samsung smartwatch design unearthed in Korean patents", engadget, downloaded from the Internet at <http://www.engadget.com/2013/08/03/tentative-samsung-smartwatch-designs-unearthed-in-korean-patents/> (Aug. 3, 2013).
First Chinese Office Action for Application No. 201480058291.8, dated Jul. 31, 2017.
Honig, "Pebble smartwatch review", engadget, downloaded from the Internet at <http://www.engadget.com/2013/01/25/pebble-smartwatch-review/> (Jan. 25, 2013).
Inofuentes, "Officially announced: LG G Flex and a healing factor", ars technica, downloaded from the Internet at <http://arstechnica.com/gadgets/2013/10/officially-announced-lg-g-flex-and-a-healing-factor/> (Oct. 28, 2013).
International Preliminary Report on Patentability for Application No. PCT/US2016/019729, dated Sep. 8, 2017.
International Preliminary Report on Patentability, International Application No. PCT/US14/50972, dated Jan. 19, 2016.
International Preliminary Report on Patentability, International Application No. PCT/US14/52814, dated Mar. 1, 2016.
International Preliminary Report on Patentability, International Application No. PCT/US14/52957, dated Mar. 1, 2016.
International Preliminary Report on Patentability, International Application No. PCT/US14/55043, dated Mar. 15, 2016.
International Search Report and Written Opinion for Application No. PCT/US2016/019729, dated May 17, 2016.
International Search Report and Written Opinion, International Application No. PCT/US14/50972, dated Jan. 14, 2015.
International Search Report and Written Opinion, International Application No. PCT/US14/52814, dated Dec. 11, 2014.
International Search Report and Written Opinion, International Application No. PCT/US14/52957, dated Dec. 9, 2014.
International Search Report and Written Opinion, International Application No. PCT/US14/71859, dated Mar. 20, 2015.
International Search Report and Written Opinion, International Application No. PCT/US14/72172, dated Mar. 18, 2015.
International Search Report and Written Opinion, International Application No. PCT/US2014/055043, dated Jan. 27, 2015.
International Search Report and Written Opinion, International Application No. PCT/US2014/072313, dated Apr. 22, 2015.
International Search Report and Written Opinion, International Application No. PCT/US2014/072328, dated Apr. 22, 2015.
International Search Report and Written Opinion, International Application No. PCT/US2015/014964, dated May 14, 2015.
International Search Report and Written Opinion, International Application No. PCT/US2015/022691, dated Jul. 8, 2015.
International Search Report and Written Opinion, International Application No. PCT/US2015/026163, dated Jul. 20, 2015.
International Search Report and Written Opinion, International Application No. PCT/US2015/030254, dated Aug. 10, 2015.
International Search Report and Written Opinion, International Application No. PCT/US2015/030724, dated Aug. 14, 2015.
International Search Report and Written Opinion, International Application No. PCT/US2015/032799, dated Aug. 31, 2015.
Johan, "ASUS Waveface Ultra", techfresh.net, downloaded from the Internet at <http://www.techfresh.net/asus-waveface-ultra/> (Jan. 19, 2010).
Kahn, "Is Apple's iWatch a slap wrist band with a flexible display?", 9to5Mac Apple Intelligence, downloaded from the Internet at <http://9to5mac.com/2013/02/21/is-apples-iwatch-a-slap-wrist-band-with-a-flexible-display/> (Feb. 21, 2013).
Kaki, "10 Beautiful Nokia Concept Phones for Future Generations", DreamsRain website, downloaded from the Internet at <http://www.dreamsrain.com/2011/09/18/10-beautiful-nokia-concept-phones-for-future-genrations/> (Sep. 18, 2011).
Kelvin, "Apple iBand Envisioned by T3: Health Features, Fitness and Watch Functions (Video)", Concept Phones, downloaded from the Internet at <http://www.concept-phones.com/apple/apple-iband-envisioned-t3-health-features-fitness-watch-functions-video/> (Feb. 18, 2014).
Kelvin, "Apple iWatch 2 Concept by Jermaine Smit Lets You Change the Watch Bracelet Easily (Video)", Concept Phones, downloaded from the Internet at <http://www.concept-phones.com/apple/apple-iwatch-2-concept-jermaine-smit-lets-change-watch-bracelet-easily-video/> (Mar. 5, 2014).
Kelvin, "Apple iWatch Concept Goes Back to Basics, Looks Like Nike Fuelband", Concept Phones, downloaded from the Internet at <http://www.concept-phones.com/apple/apple-iwatch-concept-basics-nike-fuelband/> (Oct. 22, 2013).
Kelvin, "Apple iWatch Glass Hologram is an Overpowered Smartwatch (Video)", Concept Phones, downloaded from the Internet at <http://www.concept-phones.com/apple/apple-iwatch-glass-hologram-overpowered-smartwatch-video/> (Apr. 19, 2014).
Kelvin, "Apple iWatch Goes Back to the Idea of an iPod Nano With a Belt", Concept Phones, downloaded from the Internet at <http://www.concept-phones.com/apple/apple-iwatch-idea-ipod-nano-belt/> (Mar. 2, 2014).
Kelvin, "Finally, a HTC Smartwatch! We Needed Those!", Concept Phones, downloaded from the Internet at <http://www.concept-phones.com/htc/finally-htc-smartwatch-needed/> (Feb. 4, 2014).
Kelvin, "Flexible Screen X Phone Becomes a Bracelet", Concept Phones, downloaded from the Internet at <http://www.concept-phones.com/cool-concepts/flexible-screen-phone-bracelet/> (Oct. 28, 2013).
Kelvin, "HTC One Watch Render Seems Taken out of Tron", Concept Phones, downloaded from the Internet at <http://www.concept-phones.com/htc/htc-watch-render-tron/> (Oct. 14, 2013).

(56) References Cited

OTHER PUBLICATIONS

Kelvin, "iPhone 6 and iWatch Pro Get Designed by Dani Yako", Concept Phones, downloaded from the Internet at <http://www.concept-phones.com/apple/iphone-6-iwatch-pro-designed-dani-yako/> (Jun. 6, 2014).
Kelvin, "iWatch Concept is a Curved Bracelet, Runs Flappy Bird", Concept Phones, downloaded from the Internet at <http://www.concept-phones.com/apple/iwatch-concept-curved-bracelet-runs-flappy-bird/> ( Feb. 13, 2014).
Kelvin, "iWatch Goliath is a Giant on Your Wrist (Video)", Concept Phones, downloaded from the Internet at <http://www.concept-phones.com/apple/iwatch-goliath-giant-wrist-video/> (May 23, 2014).
Kelvin, "iWatch Render Goes the Way of the Nike FuelBand", Concept Phones, downloaded from the Internet at <http://www.concept-phones.com/apple/iwatch-render-nike-fuelband/> (Jan. 21, 2014).
Kelvin, "Meizu MWatch Render is Exactly What Smartwatches Need", Concept Phones, downloaded from the Internet at <http://www.concept-phones.com/cool-concepts/meizu-mwatch-render-smartwatches/> (Feb. 12, 2014).
Kelvin, "MWC 2014: Kyocera Showcases Flexible Phone That Turns Into Bracelet", Concept Phones, downloaded from the Internet at <http://www.concept-phones.com/kyocera/mwc-2014-kyocera-showcases-flexible-phone-turns-bracelet/> (Feb. 27, 2014).
Kelvin, "New Apple iWatch Render Shows us an Ultrathin Bracelet", Concept Phones, downloaded from the Internet at <http://www.concept-phones.com/apple/apple-iwatch-render-shows-ultrathin-bracelet/> (Oct. 16, 2013).
Kelvin, "New iWatch Design Brings Us Back the Basics of a Watch", Concept Phones, downloaded from the Internet at <http://www.concept-phones.com/apple/iwatch-design-brings-basics-watch/> (Apr. 29, 2014).
Kelvin, "Nokia Lumia 101 Smartwatch is a Nice Little, Elegant Bracelet", Concept Phones, downloaded from the Internet at <http://www.concept-phones.com/nokia/nokia-lumia-101-smartwatch-nice-elegant-bracelet/> (Dec. 3, 2013).
Kelvin, "Superb Google Smartwatch Render Created in Cinema 4D", Concept Phones, downloaded from the Internet at <http://www.concept-phones.com/google/superb-google-smartwatch-render-created-cinema-4d/> (Jan. 31, 2014).
Kim,"Analysis of iWatch-related Patents from RitFast", IHS Technology, downloaded from the Internet at <http://www.displaybank.com/letter/letter_contents.php?nm=&email-prakash%40polyera.com&mail_id=8995> (Jul. 19, 2013).
Lilienthal, "Book? Accordian? Nope. Lumino is a Gorgeous LED Lamp the Goes Wherever You Do," Digital Trends, 6 pp. (Apr. 27, 2014).
Non-Final Office Action from U.S. Appl. No. 14/188,440 dated Aug. 14, 2015.
Office Action for U.S. Appl. No. 15/054,725, dated Aug. 23, 2017.
Rastogi, "Nokia Lumia 1080: The Concept Phone", 91 mobiles, downloaded from the Internet at <http://www.91mobiles.com/blog/nokia-lumia-1080-the-concept-phone.html> (Jun. 27, 2013).
Ridden, "Emopulse Smile SmartWatch goes up for pre-order", Gizmag,downloaded from the Internet at <http://www.gizmag.com/emopulse-smile-smartwatch/27984/> (Jun. 19, 2013).
Seth, "In 2020 We Can Wear Sony Computers on Our Wrist", Yanko Design Form Beyond Function, downloaded from the Internet at <http://www.yankodesign.com/2010/05/25/in-2020-we-can-wear-sony-computers-on-our-wrist/> (May 25, 2010).
Seth, "Love This iWatch!", Yanko Design Form Beyond Function, downloaded from the Internet at <http://www.yankodesign.com/2013/07/26/love-this-iwatch/> (Jul. 26, 2013).
Seth, "My Latest Fashion Accessory", Yanko Design Form Beyond Function, downloaded from the Internet at <http://www.yankodesign.com/2009/08/11/my-latest-fashion-accessory/> (Aug. 11, 2009).
Seth, "Super Sexy Roll", Yanko Design Form Beyond Function, downloaded from the Internet at <http://www.yankodesign.com/2011/03/21/super-sexy-roll/> (Mar. 21, 2011).

Smith, "Flexi E Ink screen finds home in curved world time watch", The Register, downloaded from the Internet at <http://www.theregister.co.uk/2010/10/11/phosphor_watches_world_time/> (Oct. 11, 2010).
Smith, "Samsung smartwatch concept shown in patent hints at flexible display use", Android Authority (Aug. 3, 2013).
Smith, "Samsung's curved smartphone is the Galaxy Round, launches in Korea tomorrow (video)", engadget, downloaded from the Internet at <http://www.engadget.com/2013/10/08/samsung-galaxy-round/> (Oct. 8, 2013).
Thrystan, "Apple iWatch 2 Design Appears, More Elegant Than Ever", Concept Phones, downloaded from the Internet at <http://www.concept-phones.com/apple/apple-iwatch-2-design-appears-elegant/> (Feb. 9, 2012).
Thrystan, "BenQ Siemens Snake Concept Phone is Yet Another Bracelet-Handset", Concept Phones, downloaded from the Internet at <http://www.concept-phones.com/benq-siemens/benq-siemens-snake-concept-phone-bracelethandset/> (Feb. 9, 2009).
Thrystan, "Bracelet Phone Concept Incorporates an MP3 Player, Shines Like a Diamond", Concept Phones, downloaded from the Internet at <http://www.concept-phones.com/fashion-phones/bracelet-phone-concept-incorporates-mp3-player-shines-diamond/> (Sep. 8, 2008).
Thrystan, "CEATEC 2010 Hosts TDK's Flexible OLED Displays; Hands-on Photos Here!", Concept Phones, downloaded from the Internet at <http://www.concept-phones.com/news/ceatec-2010-hosts-tdks-flexible-oled-displays-handson-photos/> (Oct. 5, 2010).
Thrystan, "Dyson Concept Phone Charger Turns Temperature Differences Into Electricity", Concept Phones, downloaded from the Internet at <http://www.concept-phones.com/cool-concepts/dyson-concept-phone-charger-turns-temperature-differences-electricity/> (Jul. 24, 2009).
Thrystan, "Email Beeper Watch is Hip, Restarts a Trend", Concept Phones, downloaded from the Internet <http://www.concept-phones.com/cool-concepts/email-beeper-watch-hip-restarts-trend/> (Mar. 3, 2009).
Thrystan, "Flux, Portable and Wearable PC Concept", Concept Phones, downloaded from the Internet at <http://www.concept-phones.com/eco-friendly/flux-portable-and-wearable-pc-concept/> (May 5, 2008).
Thrystan, "Fujitsu Concept Phones Part 2: Judge-Dredd-Like Curvy Handset", Concept Phones, downloaded from the Internet <http://www.concept-phones.com/fujitsu/fujitsu-concept-phones-part-2-judgedreddlike-curvy-handset/> (Oct. 10, 2009).
Thrystan, "iPhone 5 Bracelet Looks Out of this World", Concept Phones, downloaded from the Internet at <http://www.concept-phones.com/apple/iphone-5-bracelet-world/> (Jul. 6, 2012).
Thrystan, "iPhone Holographic Display Concept is Surreal, Could Work", Concept Phones, downloaded from the Internet at <http://www.concept-phones.com/apple/iphone-holographic-display-concept-surreal-work/> (Aug. 22, 2009).
Thrystan, "iWatch Design Created by James Ivaldi is All Metal", Concept Phones, downloaded from the Internet at <http://www.concept-phones.com/apple/iwatch-design-created-james-ivaldi-metal/> (Jul. 29, 2013).
Thrystan, "iWatch Render in the Vision of the Ciccarese Design Team: Simply Stunning (Video)", Concept Phones, downloaded from the Internet at <http://www.concept-phones.com/apple/iwatch-render-vision-ciccarese-design-team-simply-stunning-video/> (Aug. 21, 2013).
Thrystan, "Leaf Phone Features an Organic Structure, is Made of Eco-Friendly Plastic," Concept Phones, downloaded from the Internet at <http://www.concept-phones.com/eco-friendly/leaf-phone-features-organic-structure-ecofriendly-plastic/> (Nov. 4, 2009).
Thrystan, "LG Auki Bracelet Phone Is Colorful and Elegant", Concept Phones, downloaded from the Internet at <http://www.concept-phones.com/lg/lg-auki-bracelet-phone-colorful-elegant/> (Aug. 26, 2011).
Thrystan, "LG Helix Cellphone is Also a Slap Bracelet", Concept Phones, downloaded from the Internet at <http://www.concept-phones.com/lg/lg-helix-cellphone-slap-bracelet/> (Oct. 9, 2009).

(56) References Cited

OTHER PUBLICATIONS

Thrystan, "LG Oyster, a Bracelet-Like Mobile Phone Design", Concept Phones, downloaded from the Internet at <http://www.concept-phones.com/lg/lg-oyster-braceletlike-mobile-phone-design/> (Jul. 26, 2009).
Thrystan, "New iWatch Render by Tolga Tuncer is Fancy and Classy", Concept Phones, downloaded from the Internet at <http://www.concept-phones.com/apple/iwatch-render-tolga-tuncer-fancy-classy/> (Mar. 3, 2013).
Thrystan, "Nokia Mixed Reality Concept, Future Technology Demoed at Nokia World (Video)", Concept Phones, downloaded from the Internet at <http://www.concept-phones.com/nokia/nokia-mixed-reality-concept-future-technology-demoed-nokia-world-video/> (Sep. 9, 2009).
Thrystan, "Nokia Open Bracelet Shows Incoming Calls of the Ones You Love", Concept Phones, downloaded from the Internet at <http://www.concept-phones.com/nokia/nokia-open-bracelet-shows-incoming-calls-love/> (Dec. 13, 2008).
Thrystan, "Nokia Smart Watch Concept Looks Interesting", Concept Phones, downloaded from the Internet at <http://www.concept-phones.com/uncategorized/nokia-smart-watch-concept-interesting/> (Oct. 22, 2011).
Thrystan, "Purse Bracelet Fancy Concept Phone, Designed by Yw Li", Concept Phones, downloaded from the Internet at <http://www.concept-phones.com/fashion-phones/purse-bracelet-fancy-concept-phone-designed-yw-li/> (Oct. 19, 2008).
Thrystan, "Quartz Tele Concept Should be in a Final Fantasy Game, Because It's All About Crystals", Concept Phones, downloaded from the Internet at <http://www.concept-phones.com/fashion-phones/quartz-tele-concept-final-fantasy-game-crystals/> (Sep. 8, 2008).
Thrystan, "Samsung Finger Touching Cellphone Concept Comes in Handy", Concept Phones, downloaded from the Internet at <http://www.concept-phones.com/samsung/samsung-finger-touching-cellphone-concept-handy/> (Jan. 31, 2009).
Thrystan, "Samsung Futuristic Technology Relies on Health and Flexibility (Video)", Concept Phones, downloaded from the Internet at <http://www.concept-phones.com/samsung/samsung-futuristic-technology-relies-health-flexibility-video/> (Jul. 10, 2013).
Thrystan, "Samsung S-Health Bracelet Render is Based on Tizen Os", Concept Phones, downloaded from the Internet at <http://www.concept-phones.com/samsung/samsung-shealth-bracelet-render-based-tizen-os/> (Jun. 17, 2013).
Thrystan, "Sony Ericsson Bracelet Phone, a Design That Won't Make It Into Production", Concept Phones, downloaded from the Internet at <http://www.concept-phones.com/sony-ericsson/sony-ericsson-bracelet-phone-design-production/> (Jun. 19, 2009).
Thrystan, "Sony Ericsson Ring Phone Concept by Tao Ma Will Always Be a Winner", Concept Phones, downloaded from the Internet at <http://www.concept-phones.com/sony-ericsson/sony-ericsson-ring-phone-concept-tao-ma-winner/> (Sep. 15, 2008).
Thrystan, "Speak to Me Concept Watch Phone is Hot, a Must-Have Fashion Accessory", Concept Phones, downloaded from the Internet at <http://www.concept-phones.com/fashion-phones/speak-concept-watch-phone-hot-musthave-fashion-accessory/> (Jan. 27, 2009).
Thrystan, "The Hook Bracelet Phone Concept Runs Windows Phone in a New Format", Concept Phones, downloaded from the Internet at <http://www.concept-phones.com/cool-concepts/hook-bracelet-phone-concept-runs-windows-phone-format/> (Jun. 21, 2013).
Thrystan, "The New iPod is iBangle . . . iLike iT", Concept Phones, downloaded from the Internet at <http://www.concept-phones.com/apple/ipod-ibangle-ilike/> (Oct. 23, 2008).
Thrystan, "Xbox 720 Concept is a Pyramid With Two Kinect "Eyes"", Concept Phones, downloaded from the Internet at <http://www.concept-phones.com/microsoft/xbox-720-concept-pyramid-kinect-eyes/> (Jul. 8, 2013).
Thrystan, "Yuxa is a Wearable Cellphone Made From Eco-Friendly Materials", Concept Phones, downloaded from the Internet at <http://www.concept-phones.com/eco-friendly/yuxa-wearable-cellphone-ecofriendly-materials/> (Jun. 24, 2010).
Thrystan, "ZTE Cube Phone, Another Mobile World Congress Concept", Concept Phones, downloaded from the Internet at <http://www.concept-phones.com/cool-concepts/zte-cube-phone-another-mobile-world-congress-concept/> (Feb. 14, 2008).
Vertegaal et al., "Organic User Interfaces have non-planar displays that may actively or passively change shape via analog physical inputs", Organic User Interfaces—Communications of the ACM (May 31, 2008).
Wei et al., Shape memory materials and hybrid composites for smart systems, Part II: Shape-memory hybrid composites, J. Mater. Sci., 33:3763-83 (1998).
Second Chinese Office Action for Application No. 201480056371.X, dated Apr. 2, 2020.

* cited by examiner

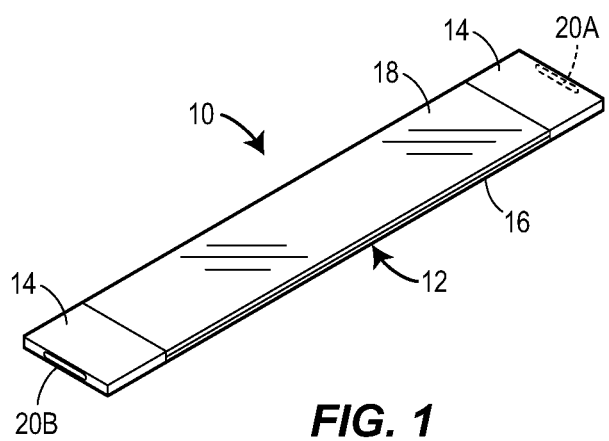
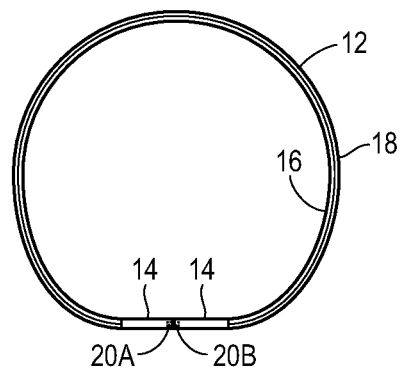
FIG. 1
FIG. 2
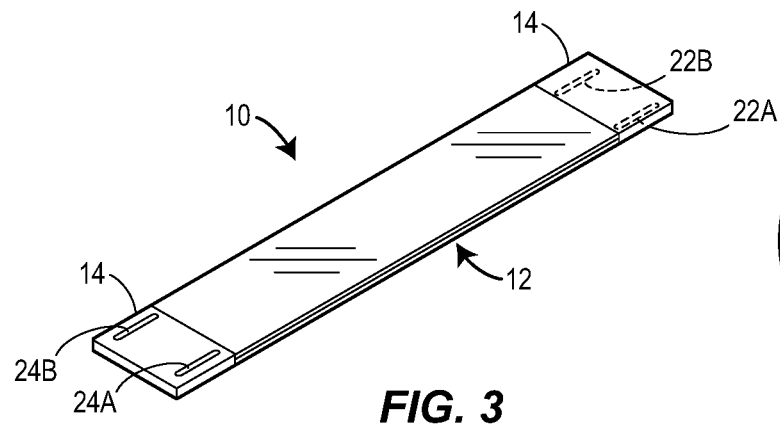
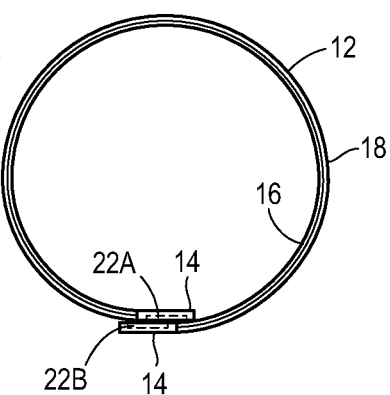
FIG. 3
FIG. 4

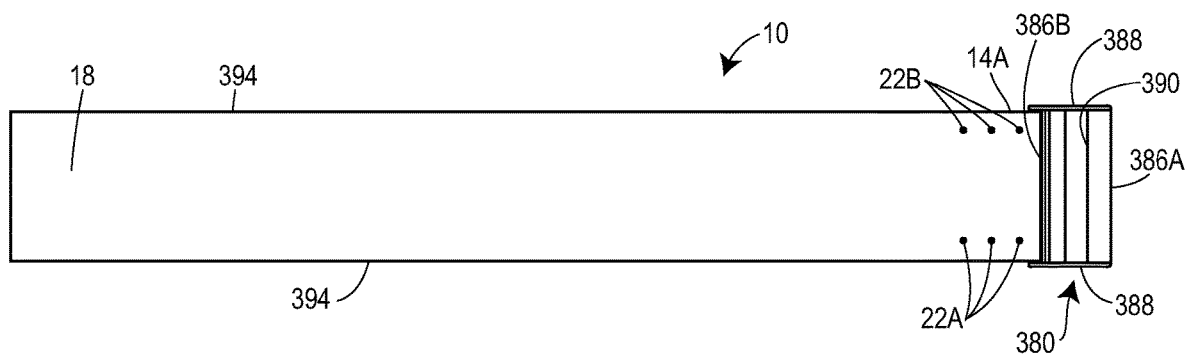
FIG. 7
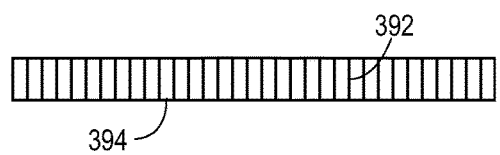
FIG. 8
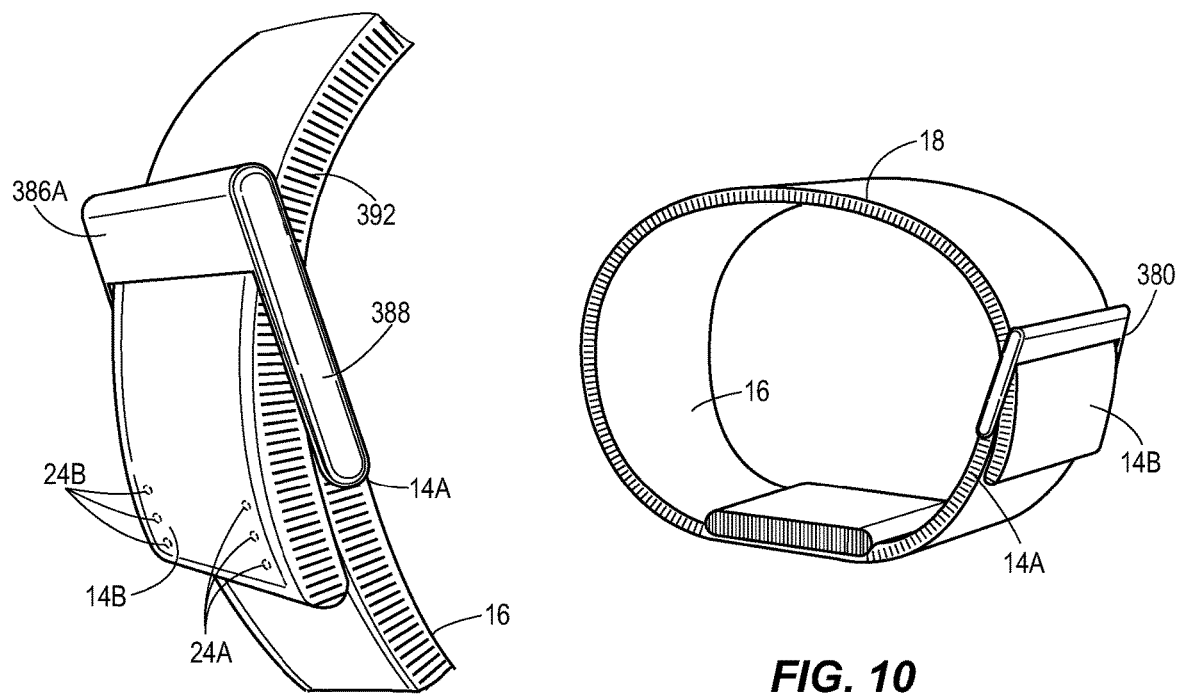
FIG. 9
FIG. 10

ATTACHABLE DEVICE HAVING A FLEXIBLE ELECTRONIC COMPONENT

RELATED APPLICATIONS

This application is a continuation application of International Patent Application No. PCT/US2016/019729 filed Feb. 26, 2016, which claims priority to and the benefit of the filing date of: U.S. Provisional Patent Application Ser. No. 62/121,488, entitled "Attachable Device Having a Flexible Electronic Component", which was filed on Feb. 26, 2015. The entire disclosure of each of these applications is hereby expressly incorporated by reference herein for all uses and purposes.

TECHNICAL FIELD

This patent application relates generally to flexible electronic components, and more particularly to dynamically flexible electronic displays incorporated into or disposed on articles that are easily attachable to other items, such as arms, mugs, shoes, belts, coffee cups, phones, computers, etc.

BACKGROUND

Electronic components such as electronic displays are commonly installed within flat, hard surfaces of electronic devices, such as computer screens, television sets, smart phones, tablet computers, etc., and in many cases are installed on accessories for the electronic devices, such as removable monitors. Many electronic devices having an electronic display are portable, and have thus become very useful in implementing mobile applications. This fact is particularly true with smart phones which have become ubiquitous. However, unfortunately, typical mobile devices such as smart phones have electronic displays that are rigid (and in some cases, flat) in nature. Thus, while these displays are useful in implementing many different applications, the device on which the display is present must still typically be held in a hand, or must be stored in a pocket, a purse, a briefcase or other container, which makes the electronic device less accessible in many situations, such as when a person is carrying other items, undertaking an athletic activity such as running, walking, etc. Moreover, in many cases these traditional electronic devices require two free hands to hold and operate, making these devices cumbersome or difficult to use or to view in situations in which, for example, a person has only one or no free hands or is otherwise occupied.

Flexible displays are generally known and are starting to come into more common usage, however, flexible displays have not been widely incorporated into easily portable items such as items of clothing, wristbands, jewelry, etc. or on items that are easily attached to other items, much less in a manner that makes the display more useable and visible to the user in many different scenarios.

SUMMARY

A dynamically flexible attachable article or device, such as a wristband, an armband, a belt, a mobile device with a foldable display, etc., includes a flexible electronic component (e.g., a flexible display, a flexible OLED light, a flexible electronic circuit) disposed thereon in a manner that is dynamically bendable or conformable to a user's wrist, arm or other curved or even flat surface. Dynamic bending or flexibility may, for example, refer to the ability to bend the attachable article, and more particularly the flexible electronic component, at a number of different points, if not every point, along a length of the flexible component, the ability to bend different portions of the attachable article differently (e.g., different portions can be bent at/to different angles or curvatures), the ability to bend the attachable article in a number of different directions (e.g., in a concave direction and a convex direction), or the ability to bend the attachable article in some other dynamic manner. The dynamically flexible, attachable article with such a flexible electronic component may be attached to or worn on a user's body, such as in the form of a wristband or on a shoe or a belt, and may bend to fit the various contours or body surfaces on which the electronic component is located. The dynamically flexible, attachable article is also easily attached to other items, such as mugs, cups, computers, phone covers, bike handles, automobile dashboards, stands, chargers, etc., that enable the flexible electronic component to be viewed when not being held in one's hands or on one's body. The flexible electronic component of the attachable article is thus, in many cases, easily viewable to a user and is capable of being manipulated or actuated by the user without having to be held in one or both of the user's hands, making the electronic component useable while the user is engaged in or performing other activities, such as running, biking, etc.

In some embodiments, the attachable article can include a band having a flexible support and first and second ends. The flexible electronic component can be disposed on the flexible support. The band can include a connection mechanism disposed proximate to one or both of the first and second ends of the band to connect two different portions (e.g., the first and second ends) of the band together. The connection mechanism may include one or more magnets and may further include a first set of uneven grooves disposed at one portion of the band and a corresponding second set of uneven grooves disposed at a second portion of the band for mating with the first set of uneven grooves. In another case, the connection mechanism may include a multiplicity of magnets disposed in series along at least one end of the band and the connection mechanism may be adjustable to enable the first and second ends of the band to be moved to different overlapping positions with respect to one another. If desired, the connection mechanism may include a series of magnets disposed along the first end of the band and a series of magnetically permeable material elements, such as metal or magnets, disposed along the second end of the band, or may include at least one magnet disposed at a first lateral end of the band and a magnetically permeable material disposed at a second and opposite lateral end of the band. The connection mechanism may further include a tab disposed at one of the first and second lateral ends of the band and a groove that accepts the tab disposed at the other of the first and second lateral ends of the band. In still other embodiments, the connection mechanism may include a hook and loop structure coupled to the band or a buckle connected to one end of the band that accepts the other end of the band through the buckle.

The flexible electronic display may be fabricated using any desired flexible electronic display material, such as any of various suitable plastics. If desired, the flexible electronic display may be manufactured as a display having pixel elements disposed on separate frontplane and backplane substrates formed of the same or different flexible material. In some cases, such as in the case in which e-paper is used as a flexible display, a frontplane component may be laminated onto a backplane component, where the backplane layer includes the backplane substrate, and the frontplane component includes an adhesion layer, optoelectronic material (which may be dissolved in a fluid that is contained in microcapsules or microcups, for example), and a top or frontplane substrate. Additional protection layers, a touch screen, and/or a frontlight may be laminated in a layer on top of the frontplane component, if desired. In any case, such layers of substrates and other components may be placed together to form the flexible electronic display, which may then be disposed on or proximate to a support, such as a leather support, a bendable metal support, etc., the combination of which can be flexed or curved in various manners to conform to the shape of a portion of a wearer's body, such as a wrist, a foot, etc. or to conform to the shape of other items to which the attachable article may be attached. In another case, the attachable electronic device may include a flexible, for example, transparent, touch screen interface disposed over or on top of the flexible electronic display to enable a user to input data or take input actions with respect to the flexible electronic display. In some cases, the inputs may be in the form of gestures or other inputs that are detected by other sensors included in the dynamically flexible, attachable device, and the gestures detected by the sensors may cause the electronic device to operate in a predetermined manner, such as to change modes of operation, etc.

Further yet, the flexible support can include or incorporate various types of structure to protect the flexible electronic component. These types of structures can include side or edge protection structures that prevent or limit damage to the flexible electronic component caused by impacts at the edge or side of the flexible electronic component. Alternatively or additionally, these types of structures can, for example, include bending limiting structure elements that operate together to limit the possible types of motion that the flexible electronic component can undergo (e.g., limit the bending radius of the flexible support to a range within a bending tolerance of the flexible electronic component). In some cases, the flexible electronic component can have a minimum critical bending radius at which the flexible electronic component can bend without impairing the flexible electronic component (e.g., cracking, breaking, or otherwise impairing one or more layers, cracking the environment or humidity barrier, impairing the electronic functionality of the component). Such a minimum critical bending radius may be the bending radius past which the flexible component becomes impaired upon a single or a low number of bendings (e.g., bending the flexible component past the minimum critical bending radius the first, second, third, etc. time results in impaired functionality), or may be the bending radius past which the flexible component (e.g., the functionality of the flexible component) is not reliable or may become impaired upon a significant number of bending motions (e.g., the minimum critical bending radius may be the minimum radius at which the electronic component may be reliably bent a significant number of times without becoming impaired).

The bending limiting structure elements can, for example, include a set of transverse bars, stays or spacers disposed in or on the flexible support to limit the torsional motion of the flexible support to thereby prevent damage to the flexible electronic component due to torsional bending of the flexible electronic component. In a similar manner one or more longitudinal members may be configured within the flexible support to limit the bending motion of the flexible support around either a longitudinal axis of the device or about a transverse axis of the device. This structure thus prevents flexing of the flexible electronic component in one or more directions so as to prevent damage to the flexible electronic component from bending motions that might delaminate the various layers of the flexible electronic component. In another case, the flexible support can have a multiplicity of interconnected pieces that each extend between first and second sides of the band and that operate together to limit the bending motion of the flexible support to a particular minimum bending radius.

In a still further embodiment, the flexible electronic component can have first and second opposing surfaces. Here, the flexible electronic component is configured to display information via the first opposing surface, wherein the flexible electronic component is disposed on the flexible support so that the first opposing surface faces away from the flexible support, and wherein the flexible electronic component includes a minimum critical bending radius when bent in a direction that that causes the first opposing surface to be convex and the second opposing surface to be concave, without impairing the flexible electronic component (e.g., impairing the functionality of the flexible electronic component). In one case, the flexible support can be bendable to allow bending that causes the first opposing surface to be convex and the second opposing surface to be concave, but that limits bending in the direction that causes the first opposing surface to be convex and the second opposing surface to be concave to a particular bending radius that is greater than or equal to the minimal critical bending radius of the flexible electronic component.

If desired, the flexible support may include a series of rigid pieces of material interconnected with hinges, wherein the hinges limit bending of the flexible electronic component when disposed on the flexible support within the bending tolerance of the flexible electronic component. The rigid pieces of material may be disposed laterally along the band and the hinges may include protrusions that interact to limit the range of bending motion of the hinge. Likewise, the flexible support may include a flexible material with rigid elements spaced laterally apart along the flexible material and the rigid elements may operate to limit bending of the flexible support in the transverse direction of the band more than in the lateral direction of the band. Additionally, the flexible support may have two portions disposed laterally adjacent to one another, wherein the first portion can be bent to a minimum radius of curvature that is different than the minimum radius of curvature to which the second portion can be bent. Also, the flexible support may have a plurality of sections disposed laterally with respect to one another along the band, wherein each section can be bent to one of a multiplicity of minimum radii of curvature, and wherein at least two of the sections can be bent to a minimum radius of curvature that is less the minimum radius of curvature of one of the other sections.

In a further embodiment, the connection mechanism can connect the two ends of the support together in a manner that maximizes the amount of continuous display surface viewable to the user when the band is disposed on the user's wrist or arm. In particular, the connection mechanism can be located at the position of the band that lies or falls on the outside of the user's wrist or arm when the band is properly attached to the wrist or arm. In this case, the discontinuity in the display surface falls at a point next to or adjacent to the outside wrist of the wearer, which is the hardest point of the display for the user to view in a natural manner, and which thus minimizes the likelihood that the user will ever need to view a portion of the display at which the discontinuity falls.

Moreover, this feature enables the user to view a continuous display along the band as the user, looking at the top of the band, turns his or her palm from a face down to a face up position, thus enabling a user to view a long continuous display screen or to view multiple different display screens without observing the portion of the display at which the discontinuity caused by the connection mechanism occurs. This feature provides for a more usable and ergonomic band, as this feature provides the maximal amount of continuous viewable display surface to the user when wearing the band.

BRIEF DESCRIPTION OF THE DRAWINGS

FIG. 1 is a perspective view of an example dynamically flexible, attachable article in the form of a wristband having a flexible display disposed thereon and a first type of magnetic connection mechanism.

FIG. 2 is a side view of the wristband of FIG. 1 bent to form a fixed length wristband.

FIG. 3 is a perspective view of an example attachable article in the form of a wristband having a flexible display disposed thereon with a second type of magnetic connection mechanism.

FIG. 4 is a side view of the example attachable article of FIG. 3 bent to form an adjustable length wristband.

FIGS. 7-10 illustrate an example attachable article in the form of a wristband having a flexible electronic display and another connection structure that includes magnets and a buckle clasp.

DETAILED DESCRIPTION

Figure 5A:
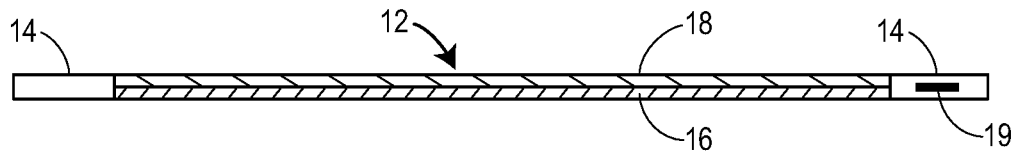
FIG. 5A is a side view of an example attachable article of FIG. 1 having a flexible display disposed on a flexible support between two clasps.

Referring now to FIGS. 1 and 2, a dynamically flexible, attachable article 10, which may be in the form of a wristband, includes a flexible band portion 12, which is generally rectangular in shape and configuration, disposed between two ends, end pieces, or fasteners 14. The band portion 12 can be configured to be stiff enough such that the band 12 can retain its shape when bent (i.e., the band 12 is not floppy). The band portion 12 includes a flexible support 16 and a flexible electronic display 18 disposed on the support 16 to be viewable from the top of the band 12, as illustrated in FIG. 1. One or more of the fasteners, end pieces, ends, or clasps 14, each of which may be made of hard plastic or other rigid material, but could instead be made of a pliable material, may include various electronic components therein for driving the flexible electronic display 18 and for providing other electronic functionality for the article 10. Additionally or alternatively, one or more various electronic components may be disposed in modules that are attached to the band 12 at locations other than with the fasteners 14.

In another embodiment illustrated in FIG. 3, the flexible attachable article 10, again illustrated in the form of a wristband, includes a similar band portion 12 and end pieces or clasps 14. However, in this case, the clasps 14 have a connection structure in the form of magnets disposed on the top or bottom sides of the clasps 14 (and possibly even a portion of the band 12) to enable the device 10 to be folded around on itself in an adjustable manner as illustrated in FIG. 4 so as to create a wristband of variable length when disposed around or connected around a wrist or other object. As illustrated in FIGS. 3 and 4, magnets or magnetic members 22A and 22B are disposed on or near a lower side of one the clasps 14, and come into contact or react with magnets or magnetic members 24A and 24B disposed on or near an upper side of the other one of the clasps 14. In some cases, the magnets or magnetically permeable elements or members 24A and 24B may be disposed within the support 16, such as in the center of the support 16, instead of on or near an upper or lower surface of the support 16. In these configurations, the clasps 14 may be disposed near or on top of one another during use and are thus connectable in various different positions with respect to one another, such as that illustrated in FIG. 4, when the flexible band 12 is bent to form a circular member to be placed around a wrist, a leg, a bicycle handle bar, etc., for example. In this manner, the dynamically flexible, attachable device 10 may be easily adjustable in size to fit various different sized mounting members. As illustrated in FIG. 4, the support or flexible material 16 of the band portion 12 is illustrated as being flexed in a manner that causes the flexible display 18 to be disposed on the exterior or outside of the band portion 12. Of course, in the configuration illustrated in FIG. 4, the magnets or metallic members 22A and 22B on the one side, and the magnets or the metallic members 24A and 24B on the other side of the band portion 12 may slide with respect to one another in the longitudinal direction of the device 10 so as to make the device 10 variable in size or circular shape to fit around different sized wrists or other mounting members. Of course, if desired, portions of the members 22A, 22B and/or 24A, 24B could be disposed in the band portion 12 in addition to or instead of in the clasps 14 and, if so disposed, would still be considered as being disposed in the end portions of the band 12. Still further, any or all of the magnetic members 22A, 22b, 24A, 24B could be a single, long piece of material, as illustrated in FIGS. 3 and 4, or could be a series of magnetic members disposed near but not contacting each other, to enable better registration of the north and south poles of the respective magnetic members in various different longitudinal locations of the band 12. This second configuration may provide for better adjustability of the length of the band 12 when both magnetic members 22 and 24 are permanent magnets.

Of course, the dynamically flexible, attachable device 10 could take on many different configurations besides those illustrated in FIGS. 1-4. For example, as a reference, FIG. 5A illustrates a side view of the device 10 of FIGS. 1-4 in more detail. In this case, the band portion 12 is illustrated as including a flexible base or a support portion 16 that may be made of any suitable flexible material such as, for example, cloth, leather, plastic or other material, while the flexible display 18 is disposed on the support 16. In other cases, the support portion 16 can be made of a rigid or semi-rigid material (e.g., hard plastic) and/or can be coupled to the flexible display 18 in a different manner. For example, the support portion 16 and the flexible display 18 can be movably (e.g., slidably) coupled to one another, such that the support 16 and the flexible display 18 can move relative to one another when the device 10 is bent. In another example, the support portion 16 can be integrally formed with the display 18.

The clasps 14 may be the same size as each other and may be the same height as the flexible display 18 and the support 16 together. In another case, the clasps 14 may be larger in height than the flexible display 18 and the support 16 and, in this case, may stick out above surface of the flexible display 18 and/or below the bottom surface of the support 16. As noted above, one or both of the clasps 14 may be or include an electronics module 19 that holds electronics, such as processors, memories, sensors, batteries, etc. that are used to power and drive the flexible display 18 and to provide other communication functionality for the device 10. In some embodiments, the electronics module 19 is not included in the clasps or fasteners 14, but is attached to the band 12 in a location separate from the fasteners 14. If desired, the components of the electronics module 19 may be sealed or otherwise protected from water, air, dirt, etc. to which the exterior of the device 10 is exposed. For example, any or all of these electronic components may be encapsulated in a hermetically sealed manner to prevent any direct exposure of these components to exterior forces and environmental hazards.

Figure 5B:
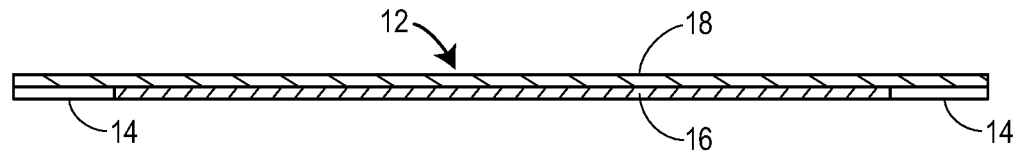
FIG. 5B is a side view of an example attachable article in the form of a wristband having a flexible display disposed over an entire length of a support.

In another embodiment, as illustrated in FIG. 5B, a dynamically flexible, attachable article in the form of a device 10 has the flexible display 18 disposed over the entire length of the support 16 and end portions 14, which may be part of the support 16. In this case, the flexible display 18 spans the entire length of the band portion 12 and of the device 10 and thus extends from end to end of the device 10. The connection structure, in the form of, for example, magnets (not shown in FIG. 5B) may be disposed in the end pieces 14 and/or, if desired, in portions of the flexible support 16.

Figure 5C:
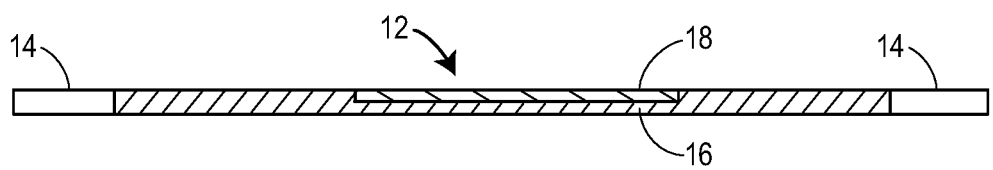
FIG. 5C is a side view of an example attachable article in the form of a wristband having a flexible display disposed on a center portion of a flexible support.

In yet another configuration, as illustrated in FIG. 5C, a dynamically, flexible attachable article 10 has a flexible display 18 disposed on a limited portion of the flexible support 16 so that the flexible display 18 is only disposed, in this case, in the center portion of the band 12. Of course, while not shown, the flexible display 18 could be disposed on any other portion of the band 12, including in portions offset from the center of the band 12 and the flexible display 18 could cover any desired amount or portion of uppers surface of the band 12. Here again, any desired connection structure could be provided in the ends of the support 16, including in the clasps 14, to connect the two ends of the band 12 together.

Figure 5D:
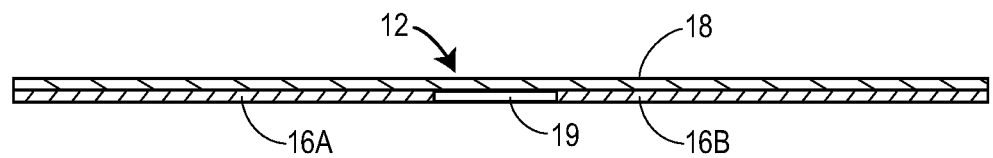
FIG. 5D is a side view of an example attachable article in the form of a wristband having a flexible display disposed over a support having two flexible end pieces connected by an electronics module.

In a still further case, as illustrated in FIG. 5D, a dynamically flexible, attachable article 10 has a flexible display 18 disposed over a support 16 having two flexible end pieces 16A and 16B connected by an electronics module 19 which, in this case, is illustrated is being disposed in the center of the flexible support 16. The electronics module 19 may or may not be made of a flexible material and in either case is still part of the flexible support 16. Moreover, while being illustrated in the center of the support 16, the electronics module 19 could be disposed at any other location along the support 16 including at any position offset from the center of the support 16. Again, any desired connection structure could be attached to or disposed in or on the end portions of the device 10, including the ends of the support 16.

Figure 5E:
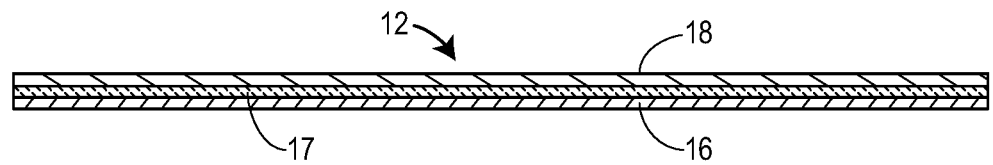
FIG. 5E is a side view of an example attachable article in the form of a wristband having a flexible display coupled to a flexible support via an interlayer disposed therebetween.

In a still further case, as illustrated in FIG. 5E, a dynamically flexible, attachable article 10 has a flexible display 18 disposed over a support 16 and coupled to the support 16 via an interlayer 17 disposed therebetween. In some cases, the interlayer 17 only serves to couple portions or segments of the display 18 to corresponding portions or segments of the flexible support 16. The interlayer 17 can be or include one or more un-patterned and/or patterned layers, such as, for example, one or more layers of foam, rubber, visco-elastic, adhesive, co-elastic material, stretchable material, other suitable material(s), or combinations thereof.

It will be appreciated from FIGS. 1-5 that the flexible display 18 can continuously span (i.e., extend) the entire length of the band 12 or can instead continuously span only a portion of the length of the band 12. In instances in which the flexible display 18 only spans a portion of the band 12, the flexible display 18 may, for example, continuously span only ¼, ⅓, ½, ⅔, ¾, more than ¼ but less than ⅓ or ½, more than ⅓ but less than ½, more than ½ but less than ⅔ or ¾, more than ⅔ but less than ¾, more than ¾ but less than the entirety, or some other portion or fraction, of the length of the band portion 12. Other ranges are of course possible as well.

Figure 6:
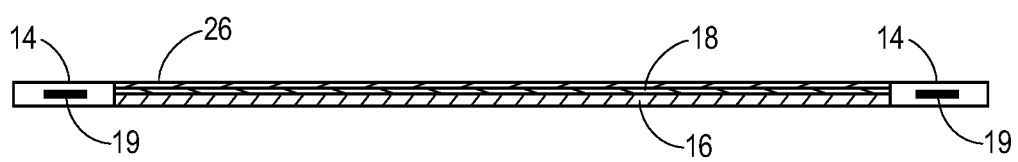
FIG. 6 is a side view of an example attachable article in the form of a wristband having a flexible touch screen disposed on a flexible display and a flexible support which are disposed between two clasps.

In another embodiment, as illustrated in FIG. 6, the dynamically flexible, attachable article 10 may be configured similarly to that of FIGS. 1-5D, but may also include a touch screen interface 26 disposed over the flexible display 18. In particular, in this case, the touch screen interface 26 can be a capacitive touch screen or any other type of touch screen interface that is transparent in nature, and thus can be laid over top of the flexible display 18 to allow the flexible display 18 to be viewable there-through. In other cases, the touch screen 26 can be disposed else (e.g., under the display 18) or can be integrated with the flexible display 18. Further yet, the touch screen interface 26 can take the form of any other suitable touch screen terminology. As will be understood, the touch screen interface 26 of FIG. 6 is powered by and controlled by the electronics disposed within one or more electronics modules 19 illustrated as being disposed, in this case, in both of the clasps 14 to perform various different types of touch detection functionality associated with a typical touch screen display. Of course, the touch screen interface 26 could be added to any of the configurations of FIGS. 5A-5D or to any of the other attachable article embodiments described herein.

In another embodiment illustrated in FIGS. 7-10, the flexible attachable article 10, again illustrated in the form of a wristband, includes a similar band portion 12 and ends 14A and 14B. However, in this embodiment, the article 10 has a connection structure that includes the magnets 22A, 22B, 24A, and 24B described above, but also includes a buckle clasp 380 that can effectuate a mechanical connection between the ends, such that the ends can be mechanically and magnetically connected to one another when the device 10 is bent, as illustrated in FIG. 9, to form a circular or oval band with the display 18 on the outside of the band. As shown in FIG. 7, the buckle clasp 380 is connected to end 14A (though it can be connected to end 14B in other embodiments) and has a frame 384. The frame 384 includes a first frame portion 386a, a second frame portion 386b, a pair of sides 388 that each connect the first frame portion and the second frame portion 386b. The buckle clasp 380 further includes an opening 390 defined between the first and second frame portions 386a, 386b. As shown in FIG. 8, the article 10 in this embodiment includes a plurality of grooves 392 defined in each of the opposing sides 394 of the article 10 which may cooperate with similar grooved structure on the inside surfaces of the sides 388.

When the flexible band 12 is bent to be disposed on or around an object (e.g., a wrist, a leg, etc.), the end 14B can be inserted or fed through the opening 390 in the buckle clasp 380, as shown in FIG. 9, and manipulated (e.g., pushed, pulled, etc.) to the desired position (which is based on the desired size of the article 10). In turn, the buckle clasp 380 and the magnets 22A, 22B, 24A, and 24B serve to connect the ends in the desired position while mechanical interactions between the frame portions 386a and 386b and the upper and lower sides of the band 12, as well as mechanical interactions between the sides 388 and the sides 394 of the band 12 limit movement of the band 12. Specifically, the first frame portion 386a applies a resistive force on a top or upper side of the device 10, which prevents movement of the ends 14A and 14B relative to one another. In addition, as shown in FIG. 9, an interior portion of each of the sides 388 (which may be grooved or otherwise provided with a rough surface treatment) engages or contacts a respective plurality of corresponding grooves 392, which also serves to prevent movement of the ends 14A and 14B relative to one another. At the same time, the magnets 22A, 22B, 24A, and 24B, by virtue of being in proximity to one another, create or provide a magnetic force that also serves to hold the ends 14 together. In this manner, the ends 14A and 14B can be both mechanically and magnetically connected to one another when the device 10 is disposed on or around the desired object, as shown in FIG. 10.

Figure 11:
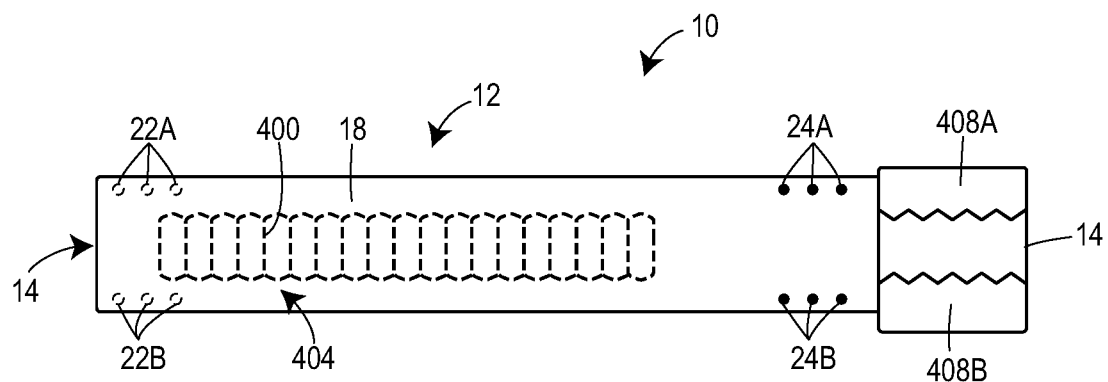
FIGS. 11-13 illustrate an example attachable article in the form of a wristband having a flexible electronic display and another connection structure that includes magnets and interlocking grooves.
Figure 12:
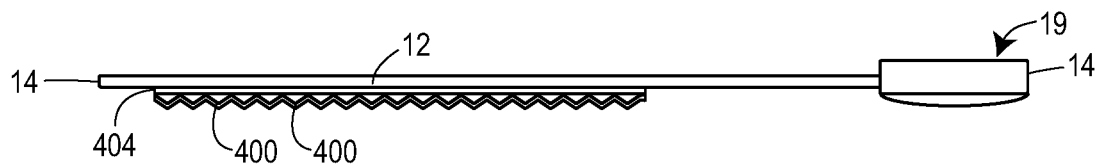
Figure 13:
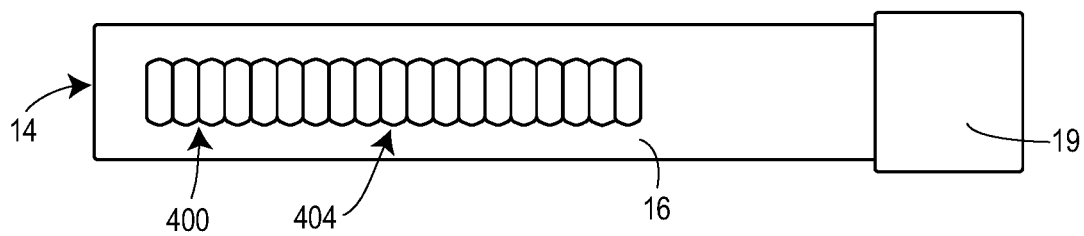

In another embodiment illustrated in FIGS. 11-13, the flexible attachable article 10 includes a similar band portion 12, ends 14A and 14B, an electronics module 19 disposed at or on one of the ends 14, and the magnets 22A, 22B, 24A, and 24B described above. The article 10 in this embodiment includes grooves 400 formed or defined in a bottom portion of the edges of a connecting element 404 that extends downward from the bottom side of the support 16, as shown in FIGS. 11-13. The grooves 400 each have a generally triangular cross-section but, in other examples, the grooves 400 can have a differently shaped cross-section (e.g., a rectangular cross-section, a semi-circular cross-section). As used herein, a groove is any structure that includes a lower surface disposed between two higher surfaces (which may be flat surfaces or ridges, for example), and that is connected to the higher services via straight, sloped or even curved sides. As shown in FIG. 13, the edges of the grooves 400 are positioned inward of the edges of the connecting element 404. In other embodiments, the grooves 400 can extend outward of the edges of the connecting element 404, in which case the grooves 400 can engage and mechanically connect with a complementary structure disposed on an interior of the electronics module 19 or another portion of the band 12. In still a further embodiment, the grooves 400 can, alternatively or additionally, be formed in the bottom side of the connecting element 404.

The end portion 14A (electronics module) of the article 10 illustrated in FIGS. 11-13 includes a plurality of projections 408 configured to engage and retain corresponding grooves 400 therein.

When the flexible band 12 is bent to be disposed on or around an object (e.g., a wrist, a leg, etc.), such that one of the ends 14 is disposed on or near an upper side of the other one of the ends 14, one or more of the grooves 400 can be disposed or seated between one or more of the projections 408A and 408B, such that the projections 408A and 408B, which extend inward, engage and serve to retain a respective one of the grooves 400. In this manner, a mechanical connection may be formed between one or more of the grooves 400 and the respective projections 408*a* and 408*b*. At the same time, the magnets 22A, 22B, 24A, and 24B, by virtue of being in proximity to one another, create or provide a magnetic force that also serves to hold the ends 14 together. So configured, the ends 14 are mechanically and magnetically connectable in various different positions with respect to one another when the device 10 is bent or curved to be placed around a wrist, a leg, a bicycle handle bar, etc., for example. As a result, the attachable device 10 may be easily adjustable in size to fit various differently-sized mounting members. As one of ordinary skill in the art will appreciate, the grooves 400 disposed or seated between the projections 408*a* and 408*b* can be repositioned, relative to those projections, to adjust the attachable device 10 to fit a differently sized mounting member (e.g., a leg instead of an arm).

In other embodiments, the connection structure can include any of the above-described mechanical connectors in combination with a different configuration of magnets. For example, the connection structure can include the clasp 350 in combination with the magnetic materials 20A and 20B described in connection with FIGS. 1 and 2. Moreover, in other embodiments, the connection structure can utilize one or more of the above-described mechanical connectors and/or other mechanical connectors in combination. For example, the connection structure could alternatively include the grooves 400 and the projections 408A and 408B as well as the clasp 350. Such a connection structure would provide an even stronger and more durable connection between the end pieces 14 of the device 10. In further alternative embodiments, different mechanical connectors can be used. For example, the connection structure can include a recess formed on a top or bottom side of one of the clasps 14 and a cooperating tab that extends upward from one of the clasps 14 and can be inserted into the recess.

Further yet, the connection structure can include a connection mechanism that provides a releasably lockable or secure connection between the ends 14 of the article 10 or between various portions of the band or support 16. In a first position or configuration (e.g., when the device 10 is bent or curved to be placed around a wrist, a leg, a bicycle handle bar, etc., for example), the connection mechanism can lock or secure the ends 14 of the article 10 or other portions of the band 16 together, thereby providing a strong, secure, and durable connection. When desired, the connection mechanism can be moved (e.g., released, disengaged, actuated) to a second position or configuration in which the connection mechanism does not lock or secure the ends 14 of the article 10 or other portions of the band 16 together, such that the ends 14 of the article 10 or other portions of the band 16 are freely movable relative to one another. This may, for example, allow the user to adjust the size of the device or re-position the device 10 (e.g., completely remove the device 10 from the wrist, the leg, the bicycle handle bar, other object or body part, etc.) In some cases, movement of the connection mechanism from the first configuration to the second configuration will automatically drive or force the connected portions (e.g., the ends 14 of the article 10) apart from or out of connection with one another, while in other cases, movement of the connection mechanism from the first configuration to the second configuration simply releases or severs the locked or secure connection, thereby allowing the user of the device 10 to manually separate the connected portions (e.g., the ends 14). If desired, the connection mechanism can be biased to either the first or section configuration or position, depending on the structure. FIGS. 68A-68E illustrate different examples of releasable connection mechanisms.

Figure 14A:
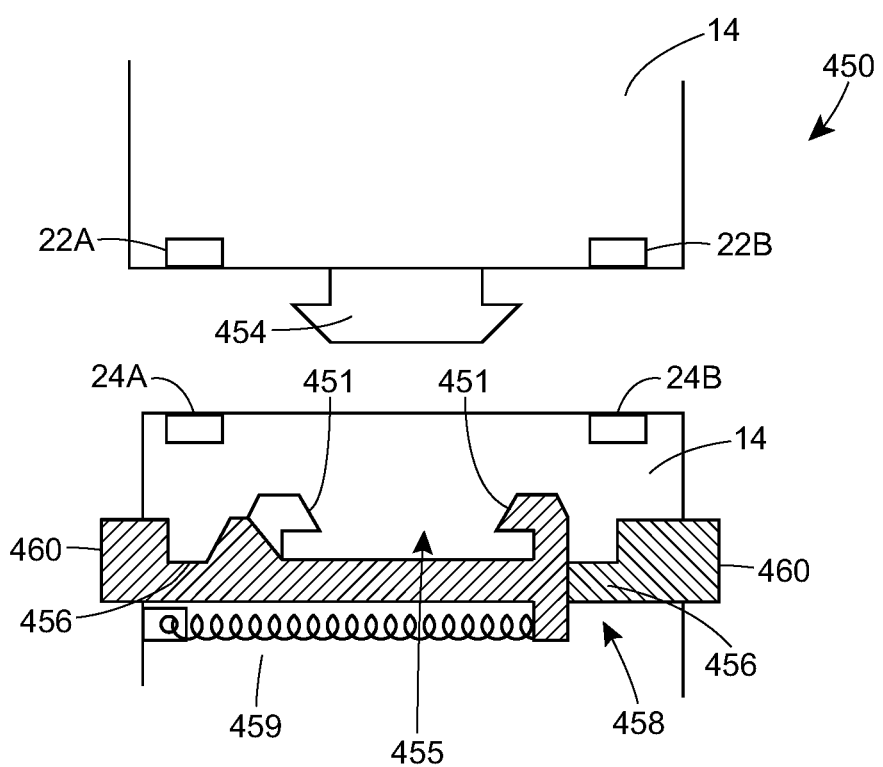
FIG. 14A illustrates one example of a connection mechanism that can be used to effectuate a releasably lockable connection between various portions of the wristband of any of the attachable articles of FIGS. 1-13.

FIG. 14A illustrates a releasable connection mechanism 450 that can be used in combination with magnets 22A, 22B, 24A, and 24B to effectuate a releasably lockable or secure connection between the ends 14 of the article 10. As illustrated in FIG. 14A, the releasable connection mechanism 450 includes a tab 454 that is formed or defined on, and extends outward from, one of the ends 14 of the device 10, and a latch 458 formed or defined at or proximate to the other one of the ends 14 of the device 10. The tab 454 can be horizontally or laterally disposed or inserted into a slot 455 defined by two opposing arms 456 of the latch 458 to mechanically connect the opposing ends 14 of the device 10 to one another when the band 12 is bent to be disposed around or on a wrist, an arm, etc., for example. The latch 458 is biased to retain the tab 454 within the slot 455 of the latch 458, with latch surfaces 457 of the arms 456 of the latch 458 applying inward forces on the tab 454, thereby effectuating a secure and durable connection. The latch 458 is, in this example, biased by way of a biasing element 459, e.g., a spring, coupled to and disposed between a fixed portion of the device 10 and one of the arms 456; in other examples, the latch 458 can be biased in a different manner. At the same time, the magnets 22A, 22B, 24A, 24B, which will be in proximity to one another when the tab 454 is disposed in the slot of the latch 458, will create or provide a magnetic force that also serves to hold the ends 14 of the device 10 together.

When desired, the connection mechanism 450 can be actuated or released, by a user of the device 10, by pressing exposed portions 460, which may, for example, take the form of buttons, of the arms 456. When the user applies a force to the exposed portions 460 that exceeds the biasing force provided by the biasing element 459, the portions 460 are driven inward, which in turn drives the latch surfaces 457 apart from one another, thereby widening the slot 455 and allowing the tab 454 to be released from the slot 455. In turn, the user can, by applying a force that overcomes the magnetic force, separate the ends 14 of the device 10 (e.g., so as to re-size the device 10 or re-position the device 10).

Figure 14B:
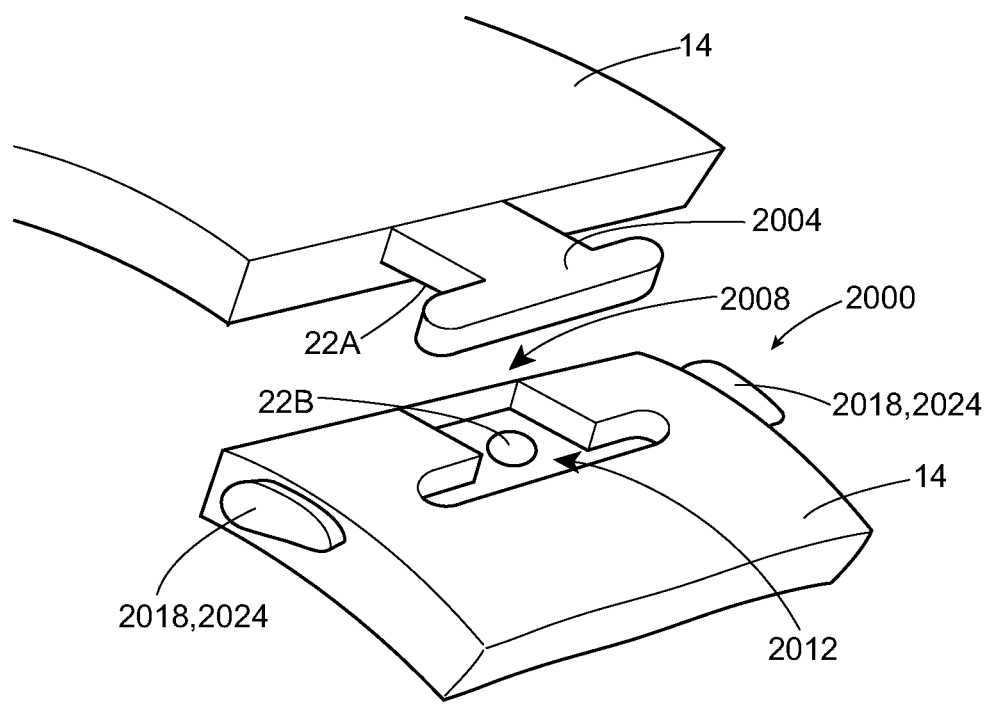
FIG. 14B illustrates another example of a connection mechanism that can be used to effectuate a releasably lockable connection between various portions of the wristband of any of the attachable articles of FIGS. 1-13.
Figure 14C:
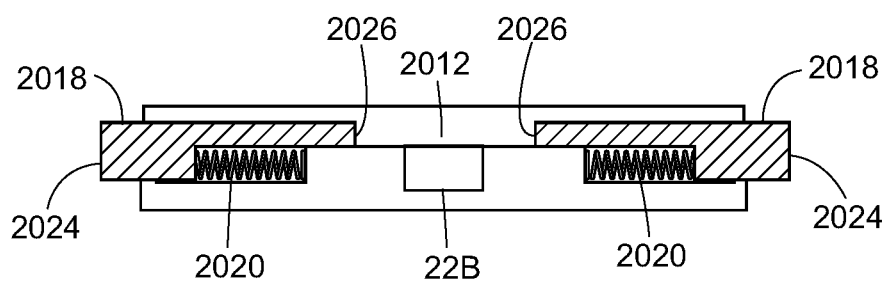
FIG. 14C is a partial, cross-sectional view of the connection mechanism of FIG. 14B.

FIGS. 14B and 14C illustrate another connection mechanism 2000 that can be used to effectuate a releasably lockable or secure connection between the ends 14 of the article 10. Like the connection mechanism 450, the connection mechanism 2000 includes a tab 2004 formed or defined on, and extending outward from, one of the ends 14 of the device 10, and a latch 2008 formed or defined at or proximate to the other one of the ends 14 of the device 10. It will be appreciated that the connection mechanism 2000 operates in a similar manner as the releasable connection mechanism 450, with the result that the tab 2004 can be releasably disposed or inserted into a slot 2012, formed or defined at or proximate to the same end 14 of the article 10 as the latch 2008, to effectuate a secure or locked, but releasable, connection between the ends 14 of the article 10. However, the connection mechanism 2000 is different because the tab 2004 can be vertically disposed or inserted into the slot 2012, rather than horizontally or laterally disposed or inserted into the slot (as is the case with the mechanism 450).

Like the latch 458, the latch 2008 is biased to an outward or extended position, whereby arms 2018 of the latch 2008 are partially exposed, or extend partially outward from the device 10. The latch 2008, and the arms 2018, are biased to this position by way of a pair of biasing elements 2020, e.g., a pair of springs, with one biasing element 2020 coupled to and disposed between a first fixed portion of the device 10 and one of the arms 2018 and the other biasing element 2020 coupled to and disposed between a second fixed portion of the device 10 and the other one of the arms 2018. When the latch 2008 is biased to this position, the tab 2004 can be vertically disposed or inserted into the slot 2008, with inner surfaces 2026 of the arms 2018 engaging and applying inward forces on the tab 2004 within the slot 2008, thereby effectuating a secure and durable connection.

As illustrated in FIG. 14B, the connection mechanism 2000 can be used in combination with magnets 22A, 22B, with the magnet 22A disposed or formed on a portion of the tab 2004 (e.g., a bottom of the tab 2004), and the magnet 22B disposed or formed in/on a portion of the slot 2012. The magnets 22A, 22B, when in proximity to one another (which will happen when the tab 2004 is in the slot 2012), will thus create or provide a magnetic force that also serves to hold the ends 14 of the device 10 together. Optionally, magnets 22A, 22B, 24A, 24B can also be formed or disposed on the opposite ends 14 of the device 10, just as described above in FIG. 14A.

When desired, the connection mechanism 2000 can be actuated or released, by a user of the device 10, by pressing exposed portions 2024 of the arms 2018. When the user applies a force to the exposed portions 2024 that exceeds the biasing force provided by the biasing elements 2020, the latch 2008 is released from its biased position. When this happens, the portions 2024 are driven inward, which in turn drives inner surfaces 2026 (which may, for example, be curved or jagged) of the arms 2018 inward, toward one another, and into the slot 2012, thereby contacting the tab 2004 and driving the tab 2004 out of the slot 2012 (the driving force will exceed the magnetic force). The user can, in turn, re-size the device 10 or re-position the device 10.

Figure 14D:
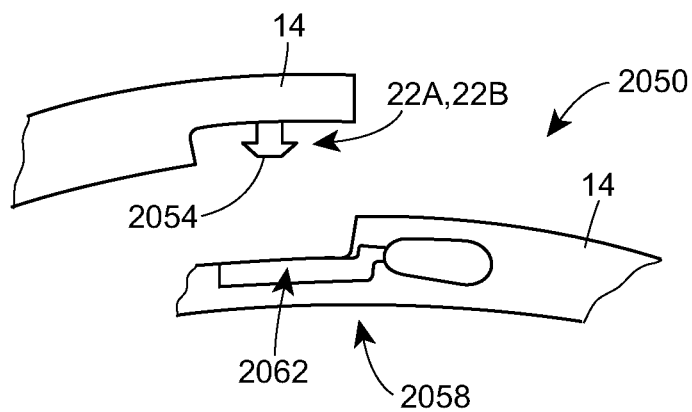
FIGS. 14D and 14E illustrate another example of a connection mechanism that can be used to effectuate a releasably lockable connection between various portions of the wristband of any of the attachable articles of FIGS. 1-13.
Figure 14E:
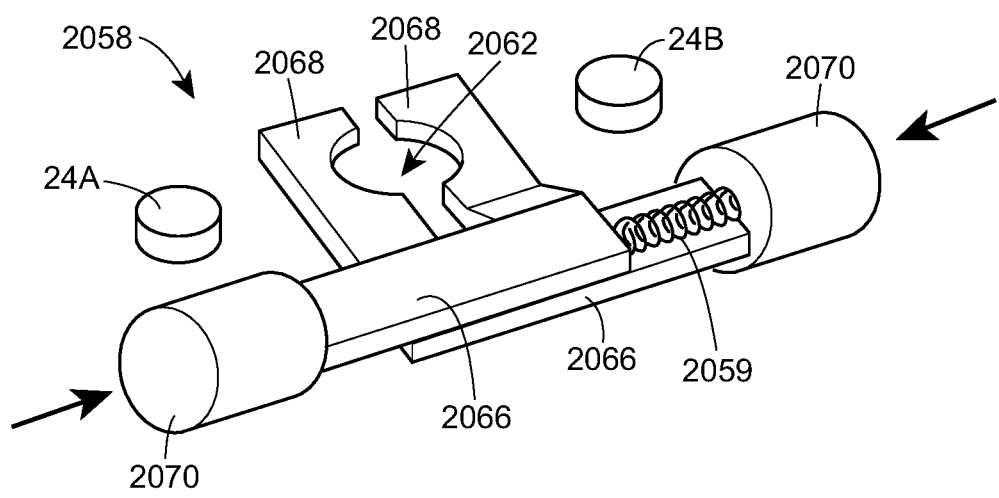

FIGS. 14D and 14E illustrate another connection mechanism 2050 that can be incorporated into the article 10 and used to effectuate a releasably lockable or secure connection between the ends 14 of the article 10. Like the connection mechanism 450, the connection mechanism 2000 includes a tab 2054 formed or defined on, and extending outward (downward, in FIG. 14D) from, one of the ends 14 of the device 10, and a latch 2058 formed or defined at or proximate to the other one of the ends 14 of the device 10. It will be appreciated that the connection mechanism 2050 operates in a similar manner as the releasable connection mechanism 450, with the result that the tab 2054 (which in this example is shaped like a mushroom) can be releasably disposed or inserted into the latch 2058 to effectuate a secure or locked, but releasable, connection between the ends 14 of the article 10. Like the tab 2004, the tab 2054 can be vertically disposed or inserted into a slot 2062 defined by opposing arms 2066 of the latch 2058. The latch 2058 is biased in a similar manner as the latch 458. More specifically, the latch 2058 is biased to retain the tab 2054 within the slot 2062, with latch surfaces 2068 of the arms 2066 each applying an inward force on the tab 2054, thereby effectuating a secure and durable connection. The latch 2058 is, in this example, biased by way of a biasing element 2059, e.g., a spring, coupled to and disposed between a fixed portion of the device 10 and a portion of one of the arms 2066; in other examples, the latch 2058 can be biased in a different manner.

As illustrated in FIGS. 14D and 14E, the connection mechanism 2050 can be used in combination with magnets 22A, 22B, 24A, 24B, with the magnets 22A and 22B formed or disposed on one end 14 of the article 10 (adjacent the tab 2004) and the magnets 24A and 24B formed or disposed on the other end 14 of the article (adjacent the latch 2058). The magnets 22A, 22B, 24A, and 24B when in proximity to one another (which will happen when the tab 2054 is seated in the slot 2062), will thus create or provide a magnetic force that also serves to hold the ends 14 of the device 10 together.

When desired, the connection mechanism 2050 can be actuated or released, by a user of the device 10, by pressing exposed portions 2070 of the arms 2066. When the user applies a force to the exposed portions 2070 that exceeds the biasing force provided by the biasing element 2059, the portions 2070 are driven inward, toward one another, which in turn drives the latch surfaces 2068 apart from one another, thereby widening the slot 2062 and allowing the tab 2054 to be released from the slot 2062. In turn, the user can, by applying a force that overcomes the magnetic force, separate the ends 14 of the device 10 (e.g., so as to re-size the device 10 or re-position the device 10).

Figure 14F:
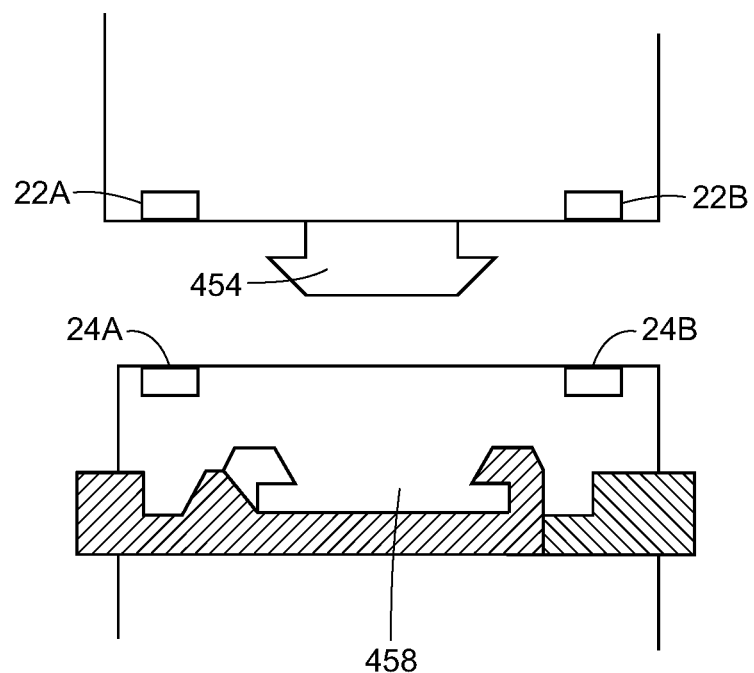
FIG. 14F illustrates another example of a connection mechanism that can be used to effectuate a releasably lockable connection between various portions of the wristband of any of the attachable articles of FIGS. 1-13.

While the connection structures illustrated in FIGS. 14A-14E utilize opposite polarity magnets that, when in proximity to one another, create or provide a magnetic attraction force that enhances the strength and durability of the connection, it will be understood that same polarity magnets can alternatively or additionally be incorporated into the device 10 to create a magnetic repulsion force that, when the connection between portions of the device 10 has been released, helps to drive those previously connected portions of the device 10 apart from one another. As an example, as illustrated in FIG. 14F, the magnets 22A and 24A can have the same polarity, such that when the connection mechanism 450 is actuated or released, thereby allowing the tab 454 to be released from the slot of the latch 458, the magnets 22A and 24A will create or provide a magnetic repulsion force that drives the opposite ends 14, and thus the tab 454 and the latch 458, away from one another.

Figure 14G:
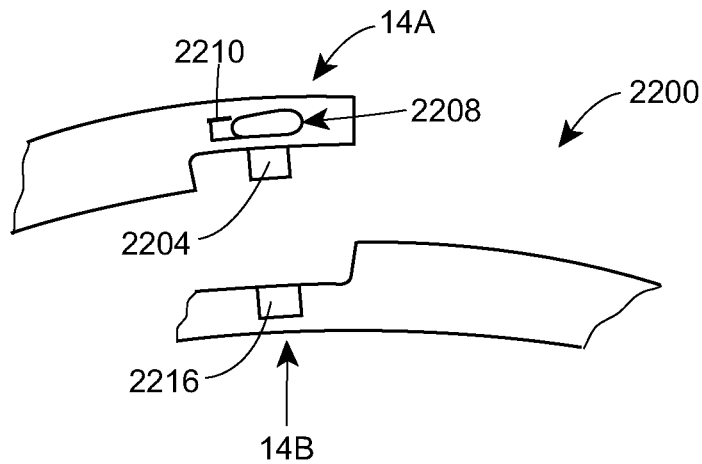
FIGS. 14G and 14H illustrate another example of a connection mechanism that can be used to effectuate a releasably lockable connection between various portions of the wristband of any of the attachable articles of FIGS. 1-13.
Figure 14H:
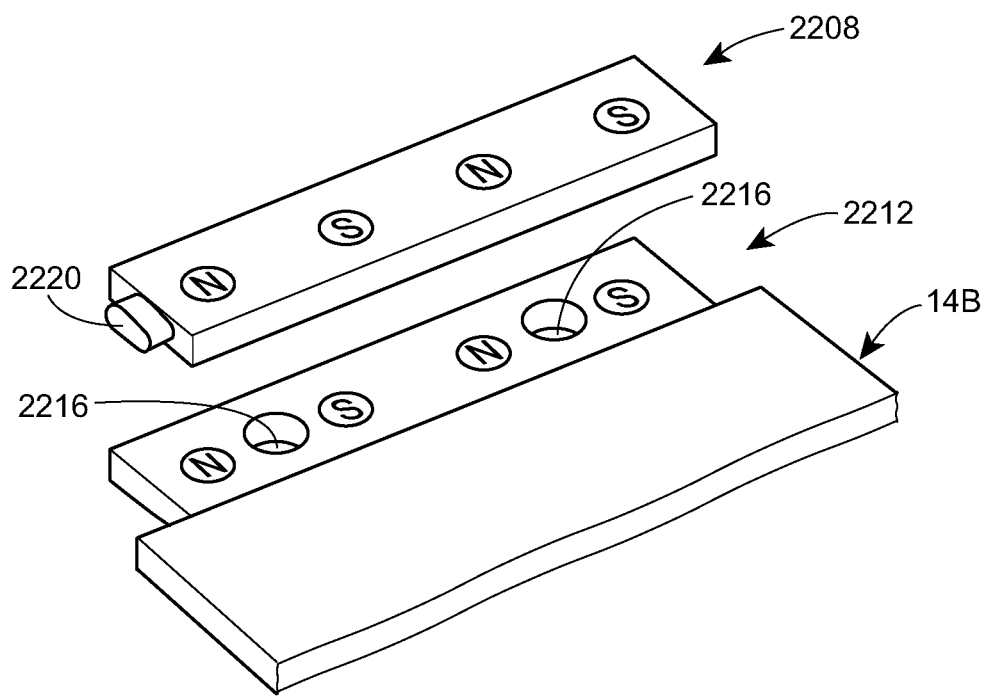

FIGS. 14G and 14H illustrate yet another connection mechanism 2200 that can be incorporated into the article 10 to effectuate a releasably lockable or secure connection between opposite ends 14 of the article 10. The connection mechanism 2200 includes or is formed by a pair of projections 2204 (only one of which is visible in FIG. 14G) formed or disposed proximate to one end 14A of the article 10, a first bar 2208 slidably disposed or inserted into a recess 2210 formed proximate to the same end 14A (and the projections 2204_, and a second bar 2212 disposed or formed at the opposite end 14B of the article 10. The first bar 2208 includes a plurality of magnets that alternate by polarity, e.g., four magnets arranged in the following order: N, S, N, S. The second bar 2212 also includes a plurality of magnets that alternate by polarity, as well as a pair of recesses 2216 sized to receive the projections 2204, respectively, therein. The second bar 2212 can include the same or a different number of magnets as the first bar 2208, and the magnets in the second bar 2212 can be arranged in an identical order as the first bar 2208 (e.g., both can have magnets arranged in the following order: N, S, N, S) or in a different order (e.g., the magnets of the second bar 2212 can be arranged in the following order: S, N, S, N). Optionally, the first bar 2208 can include a handle 2220 that allows an end user of the article 10 to remove the bar 2208 and replace the bar with a bar having a different arrangement of magnets (e.g., a bar having magnets arranged in a different order).

The projections 2204 can be vertically disposed or inserted into the recesses 2216 of the second bar 2212, respectively, to mechanically connect the opposing ends 14A, 14B of the device 10 to one another when the band 12 is bent to be disposed around or on a wrist, an arm, etc., for example. When the first bar 2208 is positioned such that the magnetic polarities of the magnets of the 2208 are opposite the magnetic polarities of the correspondingly disposed magnets of the bar 2212, this creates or provides a magnetic attraction force that can strengthen the mechanical connection formed between the projections 2204 and the recesses 2216. When, however, the first bar 2208 is positioned (e.g., moved) such that the magnetic polarities of the magnets of the 2208 match the magnetic polarities of the correspondingly disposed magnets of the bar 2212, this creates or provides a magnetic repulsion force. In some cases, this magnetic repulsion force can help to sever the mechanical connection between the projections 2204 and the recesses 2216, while in other cases, this magnetic repulsion force can, when the projections 2204 have already been removed from the recesses 2216, help to drive the opposite ends 14A, 14B of the article 10 apart. In this manner, the state of the attraction between the magnets in the bars 2208, 2212 can be changed, depending upon the position of the bar 2208, to achieve the desired purpose.

In other examples, the magnets can be arranged differently and still achieve the intended purpose. In one example, one or more magnets can be circumferentially arranged around the projections 2204 and one or more magnets can be circumferentially arranged around the recesses 2216.

In some instances, it may be desirable to adjust (e.g., expand, reduce) the length of the band 12 to accommodate or fit differently-sized mounting members (e.g., a leg instead of an arm). It may also or instead be desirable to add or increase functionality, such as battery capacity, charging capability, sensing capability, connectivity, and/or display capability, to the device 10. Accordingly, one or more extenders 250 can be removably coupled to one or both of the first and second ends 14A, 14B of the band 12 to adjust the length of the band 12 and/or to add or increase functionality to the device 10. It will be understood that any number of extenders 250 can be used, depending on the desired length of the band 12 and/or the desired functionality.

Figure 15:
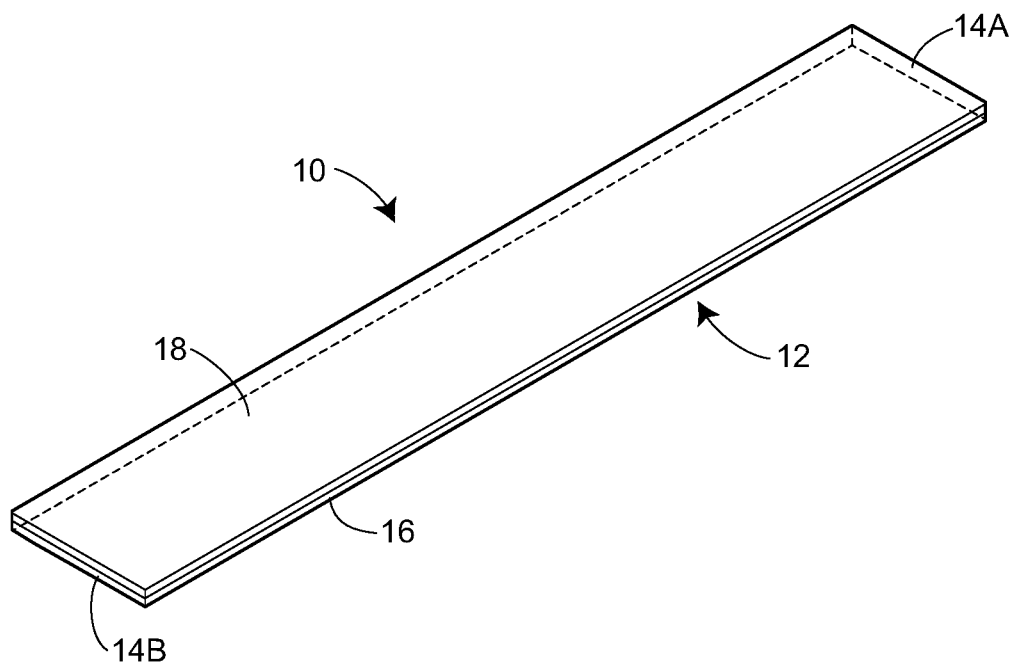
FIG. 15 illustrates a plurality of extenders that can be removably coupled to an attachable article to adjust a length of the attachable article.
Figure 15:
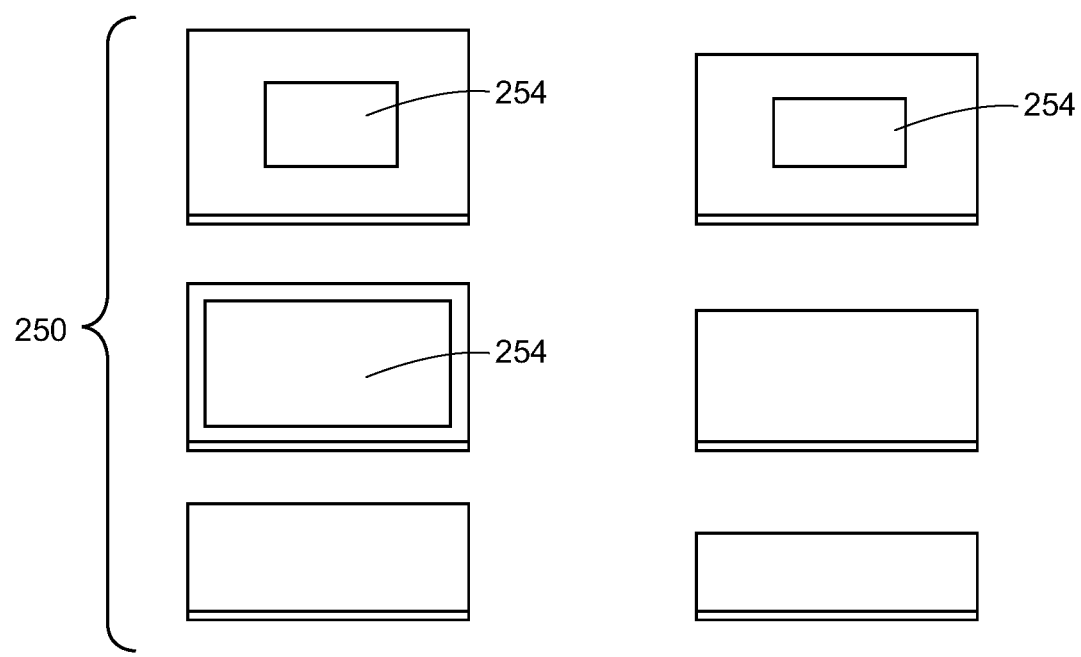

FIG. 15 illustrates a number of different extenders 250 that can be removably coupled to one or both of the ends 14A, 14B of the band 12. The extenders 250 illustrated in FIG. 15 have the same shape but have slightly different sizes. In other examples, the extenders 250 can have different shapes (than one another and/or the extenders 250 in FIG. 15) and/or different sizes (than one another and/or the extenders 250 in FIG. 15). The extenders 250 can have the same radius of curvature or can have different radii of curvature, such that the device 10 can accommodate different radii of curvature due to different sized mounting members (e.g., different sized wrists). Likewise, the extenders 250 can have the same arc length or can have different arc lengths, such that the device 10 need not include an excessively large number of extenders to accommodate larger mounting members (e.g., larger wrists). The extenders 250 can be made of a same or different flexible material (e.g., cloth, leather, plastic), a same or different rigid or semi-rigid material (e.g., hard plastic, metal), or various combinations of different flexible, rigid, and semi-rigid materials. As an example, two extenders 250 can be made of a flexible material while two other extenders 250 can be made of a rigid or semi-rigid material. One or more extenders 250 can include one or more hinges that permit bending of the respective extender 250. Further yet, when the support 16 is comprised of links, it is envisioned that the extenders 250 can be identical to those links, such that the extenders 250 aesthetically blend with the support 16.

To provide additional or increased functionality to the device 10, one or more of the extenders 250 can include an electronics module 19 that is disposed on or within the extender 250 and that holds electronics, such as one or more batteries, one or more chargers, one or more sensors, one or more memories, one or more processors, one or more communication modules, or combinations thereof. In addition to powering the other electronics in the electronics module 19, the one or more batteries can power other electronics in the device 10. In this manner, the one or more extenders 250 can provide battery capacity or functionality, or additional battery capacity or functionality, to the device 10. The one or more chargers can be connected to the one or more batteries and/or one or more other batteries of the device 10 and enable charging or recharging of any of these batteries using any known or desired recharging circuitry or methodology. As an example, the one or more chargers can use any desired energy harvesting technology to derive energy from a solar source, a kinetic energy source (e.g., motion of the device 10), a heat energy source, or some other external energy source. In this manner, the extenders 250 can provide charging capability or functionality to the device 10, or, when the device 10 already includes some charging capability, can provide additional charging capability or functionality to the device 10. The one or more sensors may include, for example, an impact sensor or step counter, one or more gyroscopic sensors or gyroscopes, temperature sensors (which may, for example detect the temperature of the skin of the user when the device 10 is being worn), vibration sensors, pulse rate monitors, external pressure sensors, blood pressure sensors (e.g., which may detect the blood pressure of the user wearing the device 10), heart rate sensors (e.g., which may detect the heart rate of the user wearing the device 10), accelerometers, strain gauges, gyroscopes, accelerometers, compression sensors, tensional strain sensors, positional sensors (e.g., GPS sensors), light sensors, piezoelectric sensors, or any other desired sensors. In this manner, the extenders 250 can provide sensing capability or functionality, or additional sensing capability or functionality, to the device 10. The one or more processors, which may, for example, include programmable, general purpose processors and/or specially programmed processors, can implement operation of any of the electronics of the extenders 250 and/or other electronics of the device 10. In this manner, the extenders 250 can provide computational processing capability or functionality, or additional processing capability or functionality, to the device 10. The one or more memories can be, for example, one or more flash memories or other suitable types of non-transitory, tangible, data storage media. The one or more memories can store various applications to be run on the various processors and/or various data (e.g., image or video data files). In this manner, the extenders 250 can provide memory capability or functionality, or additional memory capability or functionality, to the device 10. The one or more communication modules may include or use any type of communication hardware/software/firmware that uses any desired types of communication techniques to enable the processors to communicate with other electronics in the device 10 and/or exterior devices or sources. Of course, the communication modules could include multiple different types of communication hardware/software/firmware, including any kind of hardwire-based communication module or wireless-based communication module. As examples, the communication modules may be a wired or wireless communication module that may provide wired or wireless-based protocol (e.g., WiFi, Z-Wave, ZigBee) communications between the extenders 250 and the device 10 and other devices (including other extenders 250) or a communication network such as a LAN or a WAN to which other devices are communicatively connected. Likewise, the communication modules may be a near field communication (NFC) module or a Bluetooth communication module, which may perform near field communications or Bluetooth communications in any known or desired manner with nearby NFC or Bluetooth enabled devices, thereby enabling wireless communication between the extenders 250 and the device 10 and other closely situated or closely located electronic devices. Still further, the communications modules may include a USB or other type of wired communication module for decoding and encoding USB-based communication signals to be sent out and received via the USB communication module(s). In the above-described manner, the extenders 250 can provide communication (e.g., connectivity) capability or functionality, or additional communication capability or functionality, to the device 10.

Moreover, one or more of the extenders 250 can include a display 254. The display can be similar to the flexible display 18 of the device, while in other cases the display can be a different type of display. The display can be an extension of the flexible display 18 of the device 10, while in other cases the display can be a separate display, such as, for example, an indicator display or a matrix display that, for example, reacts to certain user interactions, reacts to certain users wearing the device 10, provides different content, or performs some other desired functionality. In this manner, the extenders 250 can provide additional display capability or functionality to the device 10.

In some cases, it will be necessary for the device 10 to query the one or more extenders 250 to identify the extenders 250 and the functionalities or capabilities offered by those extenders 250. As such, the one or more extenders 250 can include a unique identifier that identifies the respective extender 250, its location, and its capabilities. Depending upon the communication capability or functionality provided by the respective extender 250, this unique identifier may be a unique NFC identifier, Bluetooth communication identifier, or some other identifier.

Finally, while not illustrated in FIG. 15, it will be appreciated that the one or more extenders 250 can include indicia, such as, for example, engravings, branding, badges, and artwork. The indicia can be added by a user of the device 10 (e.g., for self-expressive reasons) or can be added by the manufacturer (e.g., to identify an extender 250 as corresponding to a certain device 10).

As briefly noted above, the one or more extenders 250 can be removably coupled to one or both of the ends 14A, 14B of the band 12. In some cases, one or more extenders 250 can be removably coupled to only one of the ends 14A, 14B, while in other cases one or more extenders 250 can be removably coupled to each end 14A, 14B. In the event that two or more extenders 250 are utilized, these extenders 250 will also be removably coupled to one another. The extenders 250 can be removably coupled to one another in the same manner as the extenders 250 are coupled to one or both of the ends or can be removably coupled to one another in a different manner. In some cases, the extenders 250 can be removably to one another and/or to one or both of the ends in the same manner as components (e.g., links) of the support 16 are connected together.

Figure 16A:
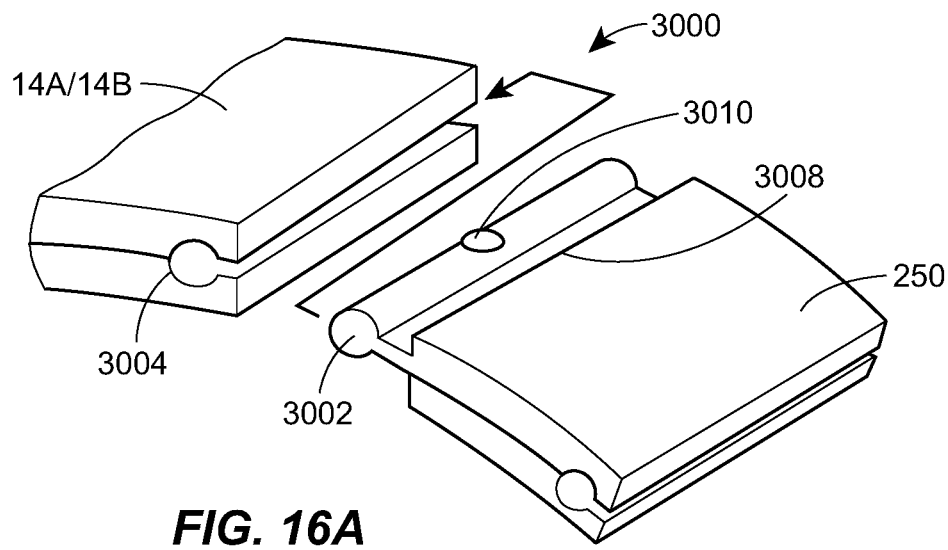
FIG. 16A illustrates one example of an arrangement that can be used to removably couple an extender to an attachable article in the form of a wristband so as adjust a length of the attachable article.
Figure 16B:
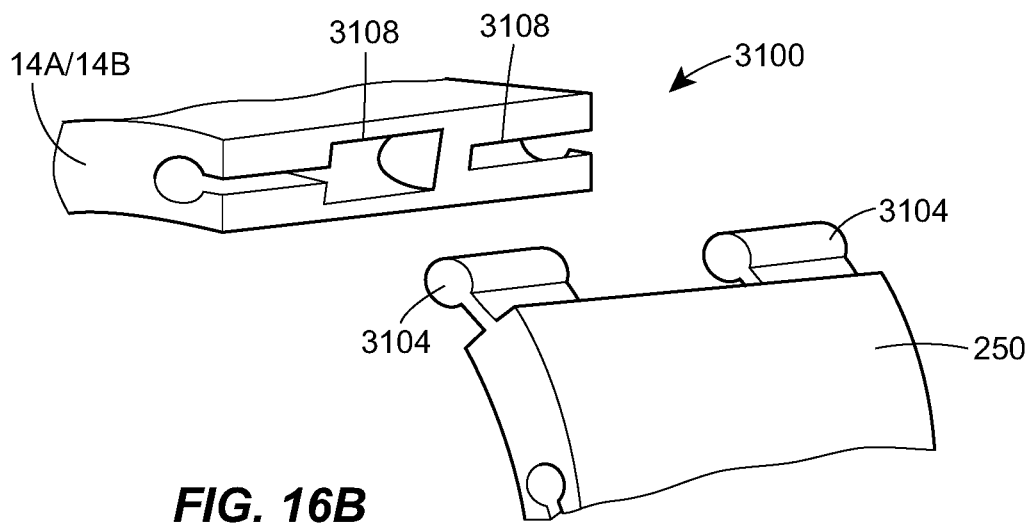
FIGS. 16B and 16C illustrate another example of an arrangement that can be used to removably couple an extender to an attachable article in the form of a wristband so as adjust a length of the attachable article.
Figure 16C:
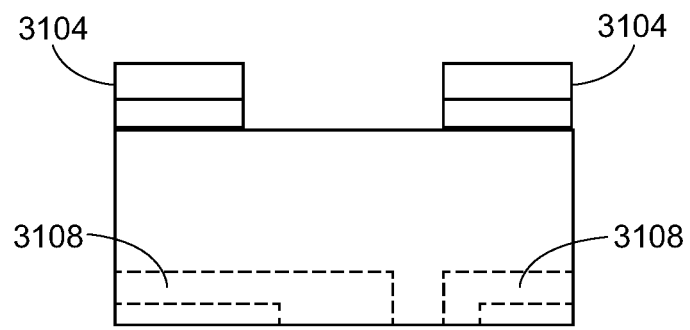
Figure 16D:
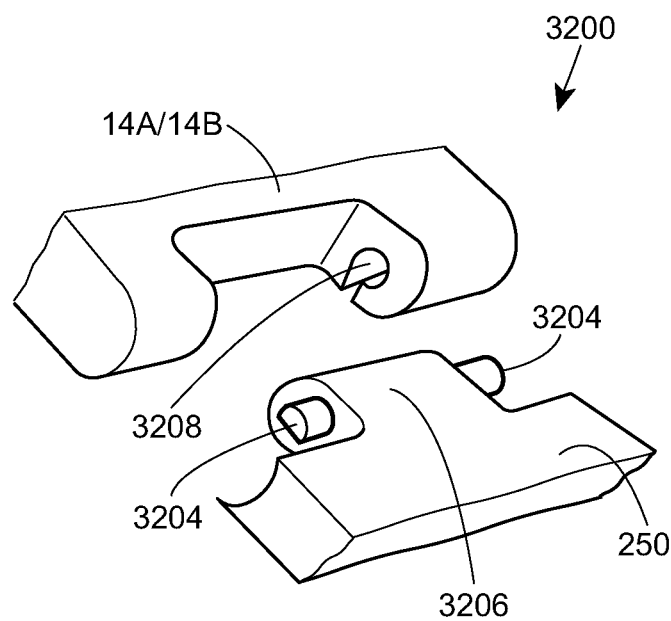
FIGS. 16D and 16E illustrate another example of an arrangement that can be used to removably couple an extender to an attachable article in the form of a wristband so as adjust a length of the attachable article.
Figure 16E:
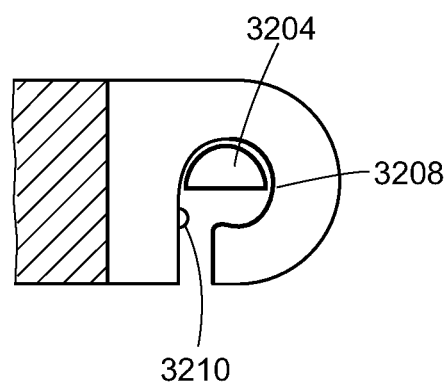

Generally speaking, it is envisioned that the one or more extenders 250 can be removably coupled to one or both of the ends 14A, 14B and to one another using a number of different connection techniques or methods. If desired, one or more of the extenders 250 can be removably coupled via a mechanical connection. As illustrated in FIG. 16A, one or more extenders 250 can be removably coupled to one of the ends 14A, 14B via a projection and a recess or slot arrangement 3000. The arrangement 3000 includes a projection 3000, which extends outward from an end 3008 of the extender 250, and a recess or slot 3004 formed or defined in the end 14A, 14B and sized to receive and retain the project 3000 therein. The projection 3000 can include a bump or other protrusion 3010 that engages (e.g., catches) a corresponding aperture (not shown in FIG. 16A) formed in a central portion of the recess or slot 3004, thereby securely retaining the projection 3000 in the recess or slot 3004. This connection can, of course, be broken or separated by a user applying a force thereto. FIG. 16B illustrates another, similar example, in which one or more extenders 250 can be removably coupled via an arrangement involving a pair of projections and a pair of recesses or slots. As illustrated in FIGS. 16B and 16C, one or more extenders 250 can be removably coupled to one of the ends 14A, 14B via an arrangement 3100 similar to, but slightly different than, the arrangement illustrated in FIG. 16A. Unlike the arrangement of FIG. 16A, which includes the projection 3000 and the slot 3004, the arrangement 3100 includes a pair of projections 3104 and a pair of recesses or slots 3108 sized to receive a respective one of the projections 3104. The projections 3104 extend outward from opposite portions of an end 3112 of the extender 250, while the slots 3108 are formed or defined in one of the ends 14A, 14B. Like the projection 3000, the projections 3104 illustrated in FIGS. 16B and 16C can include a bump or other protrusion that engages (e.g., catches) a corresponding aperture formed in the recesses or slots, respectively, thereby securely retaining the one or more projections in the respective recess or slot. The apertures are, at least in this example, formed in a central or middle portion of the recesses or slots 3108, though this need not be the case (e.g., one or more of the apertures can be positioned at any point along the respective recess). As illustrated in FIG. 16D, one or more extenders 250 can be removably coupled to one of the ends 14A, 14B via a pin and a slot arrangement 3200. The arrangement 3200 includes a projection in the form of a pin 3204 that is coupled to and extends laterally outward from an end 3206 of the extender 250, and a slot 3208 formed or defined in one of the ends 14A, 14B. The pin 3204, which has a D-shape, can be inserted or disposed into the slot 3208, and retained therein, when the extender 250 and the end 14A or 14B are rotated relative to one another at a desired angle (e.g., 90 degrees), as is illustrated in FIG. 16E. This angle can, of course, be varied by changing the shape and/or size of the pin 3204 and/or the slot 3208. The arrangement 3200 can further include a bump or other protrusion 3210, formed in or adjacent the slot 3208, that helps to retain the pin 3204 in the slot 3208 (i.e., prevents the pin 3204 from accidently falling out of the slot 3208) when the extender 250 and the end 14A or 14B are further rotated.

While FIGS. 16A-16E each illustrate some sort of bump or protrusion, it will be appreciated that magnets can instead be utilized to serve the same purpose of securely retaining a pin or projection in the slot or recess. Other mechanical connections are also possible, such as, for example, a pin and a hole arrangement (e.g., such as typically used in a conventional wristwatch), a tab and a recess arrangement (e.g., similar to the tab and recess arrangement described above), a standard charging bus (e.g., 2-, 3-, or 4-wire charging bus), a snap arrangement, or some other mechanical connection that mechanically connects the extenders 250 and the device 10 but does not, on its own, facilitate electronic communication between the extender 250 and the device 10 and other extenders 250. In cases in which the extenders 250 are equipped with functionality as described above, the communication modules of the extenders 250 can facilitate the desired connection and communication once the extender(s) 250 is(are) mechanically connected. As an example, the communication modules may facilitate NFC, Bluetooth, Z-Wave, or other wireless communication. In other cases, the mechanical connection may be paired with an electronic connection (e.g., a data bus connection) that facilitates the desired communication. For example, the standard charging bus could be paired with a standard data bus (e.g., SPI, i2C) to facilitate both the desired mechanical and electronic communication. In still other cases, the mechanical connection may be sufficient; in other words, the user may only wish to adjust the length of the band 12 and may not be concerned with the functionality provided by the extenders 250.

Figure 17A:
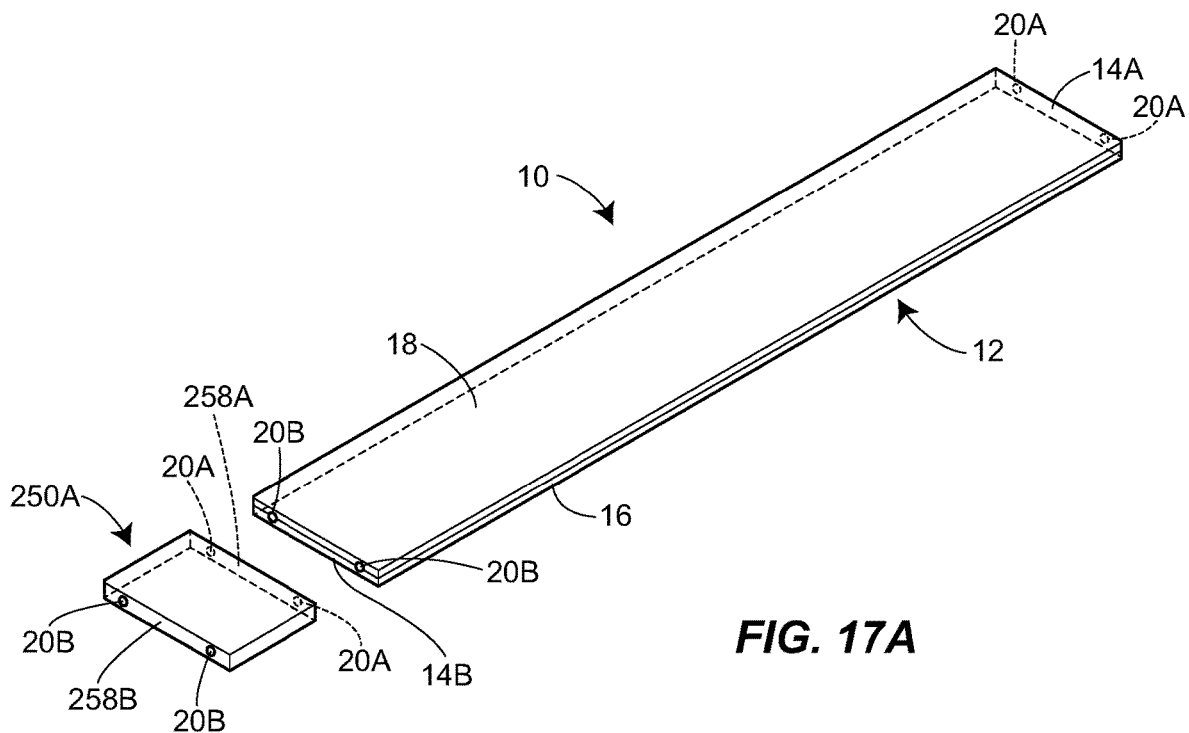
FIGS. 17A and 17B illustrate an example of an extender removably coupled to an attachable article in the form of a wristband device, via a magnetic connection, to adjust a length of the attachable article.
Figure 17B:
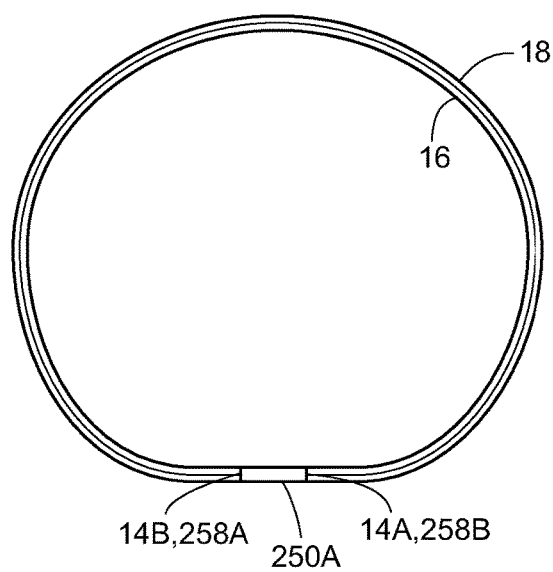

In another embodiment, one or more of the extenders 250 can be removably coupled via a magnetic connection. As illustrated in FIG. 17A, for example, magnets 20A and 20B can be disposed on the ends 14A and 14B, respectively, of the band 12 and magnets 20A and 20B can be disposed on respective ends 258A, 258B of an extender 250A. When, for example, the end 258A of the extender 250A is brought into close proximity with the end 14B of the band 12, the magnets 20A and 20B operate to connect the end 258A of the extender 250A to the end 14B of the band 12 of the device 10, thereby connecting the extender 250A to one end of the device 10. The extended device 10 can then be folded around on itself as illustrated in FIG. 17B and the end 258B of the extender 250A can be similarly connected, in an end-to-end manner, to the end 14A of the band 12. It will be appreciated that the device 10, by virtue of being extended by the extender 250A, will be longer and will therefore have a slightly different (e.g., slightly flatter or more oval) shape than the non-extended device 10 when in the folded position.

In cases in which the extender 250A is equipped with functionality as described above, the communication module(s) of the extender 250A can facilitate NFC, Bluetooth, Z-wave, or other wireless communication between the extender 250A and the device 10. In this way, the extender 250A can provide additional functionality or capability to the device 10.

Figure 17C:
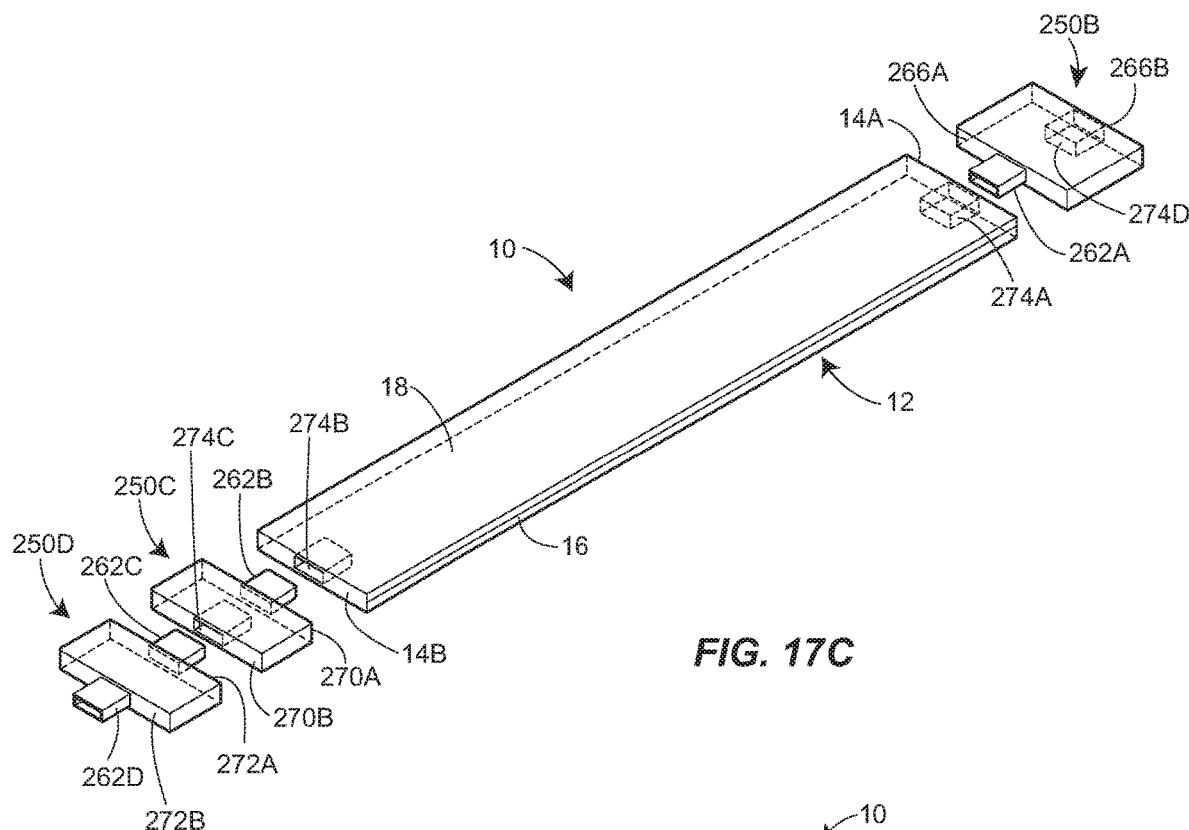
FIGS. 17C and 17D illustrate two example extenders removably coupled to an attachable article in the form of a wristband device, via a USB connection, to adjust a length of the attachable article.

In a further embodiment, one or more of the extenders 250 can be removably coupled via a dual mechanical-electronic connection that mechanically connects the one or more extenders 250 and the device 10 while simultaneously facilitating electronic communication between the extenders 250 and the device 10 and other extenders 250. For example, as illustrated in FIG. 17C, a first extender 250B can be removably coupled to the end 14A of the band 12 via a regular USB connection, and second and third extenders 250C, 250D can be removably coupled to the end 14B of the band 12 via regular USB connections. More specifically, the first extender 250B can include a regular USB plug 262A that is formed in and extends outward from a first end 266A of the first extender 250B, the second extender 250C can include a regular USB plug 262B, identical to the plug 262A, formed in and extending outward of a first end 270A of the second extender 250C, and the third extender 250D can include two regular USB plugs 262C, 262D, also identical to the plug 262A, formed in and extending outward from first and second ends 272A, 272B, respective, of the third extender 250D. To accommodate the regular USB plugs 262A, 262B, regular USB sockets 274A, 274B can be formed into the ends 14A, 14B, respectively, of the device 10. It will be understood that each of the USB plugs 262A, 262B can be inserted into either USB socket 274A, 274B. To accommodate the regular USB plugs 262C, 262D, regular USB sockets 274C, 274D can be formed into the ends 270B, 266B, respectively. In this manner, a dual mechanical-electronic connection can be facilitated between the device 10 and the three extenders 250B-250D.

Figure 17D:
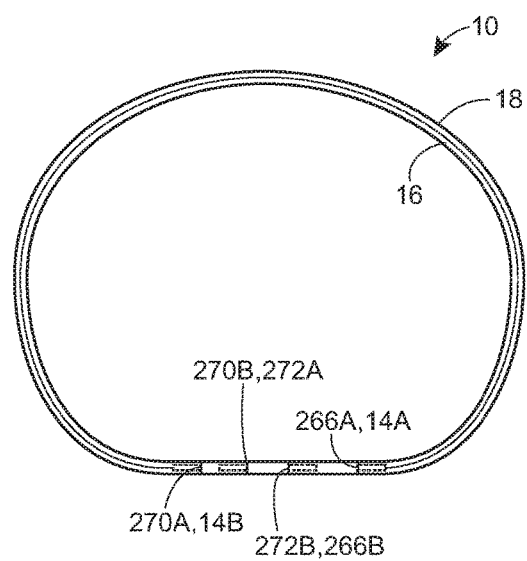

When the first end 266A of the first extender 250B is brought into proximity with the end 14A of the band 12, the USB plug 262A of the first extender 250B can be inserted into the USB socket 274A formed in the end 14A of the band 12, thereby mechanically and electronically connecting the first extender 250B to the device 10. Likewise, when the first end 270A of the second extender 250C is brought into proximity with the end 14B of the band 12, the USB plug 262B of the second extender 250C can be inserted into the USB socket 274B formed in the end 14B of the band 12, thereby mechanically and electronically connecting the second extender 250C to the device 10. Similarly, when the first end 272A of the third extender 250D is brought into proximity with the second end 270B of the second extender 250C, the USB plug 262C of the third extender 250D can be inserted into the USB socket 274C formed in the end 270B of the second extender 250C, thereby mechanically and electronically connecting the third extender 250D to the second extender 250C, and, in turn, the rest of the device 10. The extended device 10 can then be folded around on itself as illustrated in FIG. 17D. With the second end 266B of the first extender 250B in close proximity to the second end 272B of the third extender 250D, the USB plug 262D of the third extender 250D can be inserted into the USB socket 274D formed in the second end 266B of the first extender 250B to connect the second end 266B of the first extender 250B to the second end 272B of the third extender 250D in the end-to-end manner illustrated in FIG. 17D. It will be appreciated that the device 10, by virtue of being extended by the extenders 250B, 250C, will be longer and will therefore have a slightly different (e.g., slightly different or more oval) shape than the non-extended device 10 and the extended device 10 illustrated in FIG. 17B when in the folded position. Finally, in cases in which the extenders 250B, 250C, and 250D are equipped with functionality as described above, the extenders 250B, 250C, and 250D can provide additional functionality or capability to the device 10, via the USB connections.

While the connection between the extenders 250B-250D and the device 10 in FIG. 17B is described as being a standard or regular USB connection, a different type of USB connection (e.g., a micro USB connection, a mini USB connection) or another type of dual mechanical-electronic connection could be used instead. Moreover, any of the above-described connection techniques or methods could be used in combination with one another or any other desired connection technique not explicitly mentioned herein.

Of course, if desired, one or more of the extenders 250 (e.g., the extender 250A of FIGS. 17A and 17B) can be removed or detached from the device 10 in a similar manner as described herein. This might be done, for example, when it is desirable to reduce the length of the band 12 to accommodate or fit a smaller-sized mounting member (e.g., an arm instead of a leg), and/or when additional functionality provided by one or more of the extenders 250 is no longer necessary.

It will also be appreciated that while FIGS. 16A-16E and 17A-17C illustrate different ways of coupling one of the extenders 250 to one of the ends 14A, 14B of the band 12 and/or two or more extenders 250 to one another, one or more of these ways can be utilized to connect one or more components (e.g., links) of the support 16 to one another.

Figure 18A:
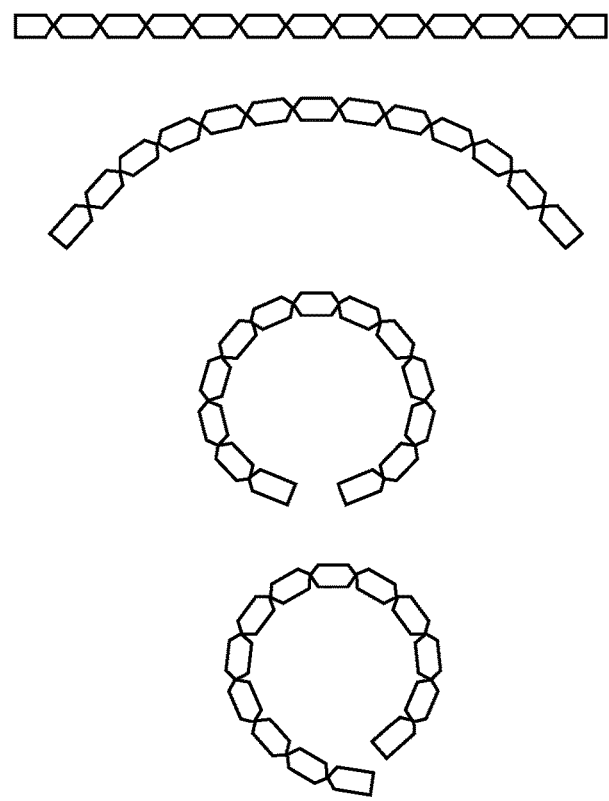
FIG. 18A illustrates a number of different positions of an attachable article in the form of a wristband device.
Figure 18B:
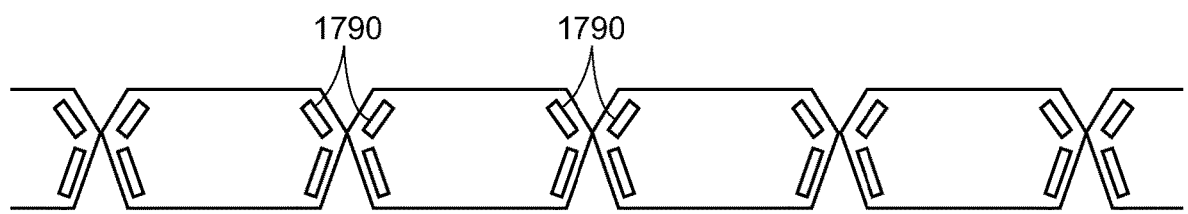
FIG. 18B illustrates one example of a mechanism that can be used to retain the shape of the wristband device in any number of different positions, including the positions shown in FIG. 18A.
Figure 18C:
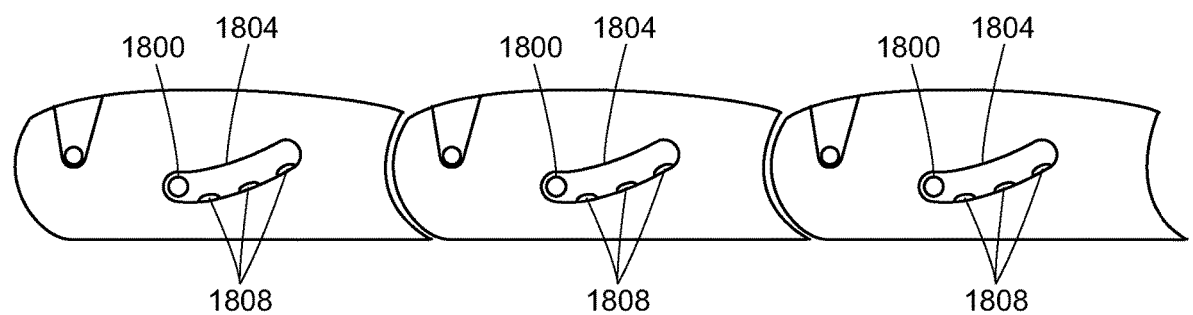
FIG. 18C illustrates another example of a mechanism that can be used to retain the shape of the wristband device in any number of different positions, including the positions shown in FIG. 18A.
Figure 18D:
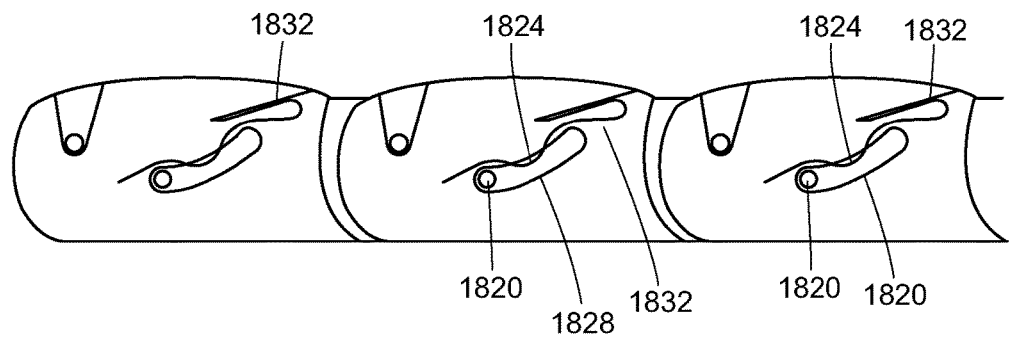
FIG. 18D illustrates another example of a mechanism that can be used to retain the shape of the wristband device in any number of different positions, including the positions shown in FIG. 18A.
Figure 18E:
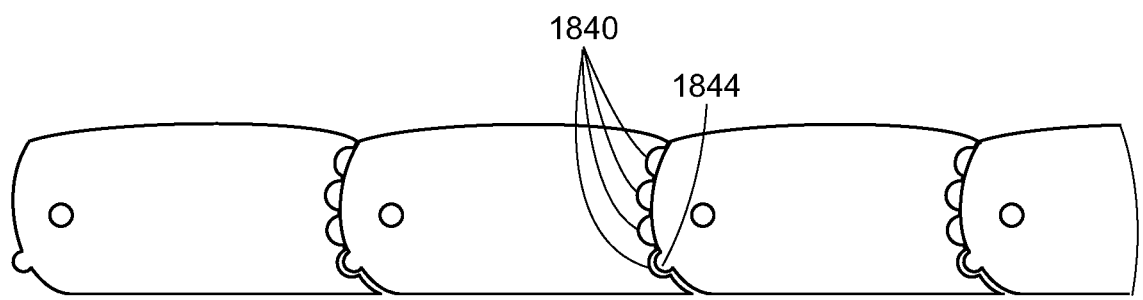
FIG. 18E illustrates another example of a mechanism that can be used to retain the shape of the wristband device in any number of different positions, including the positions shown in FIG. 18A.
Figure 18F:
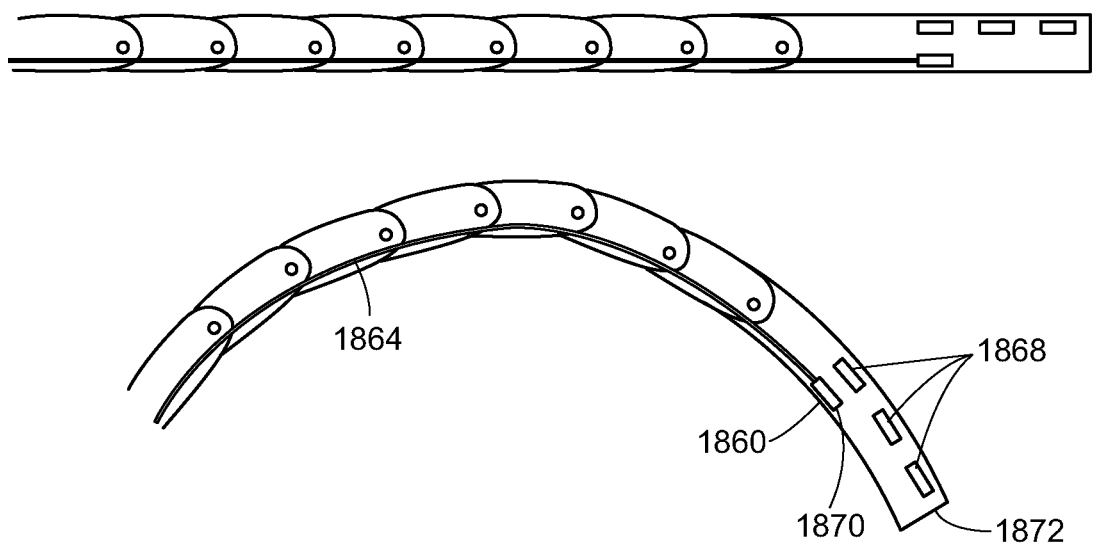
FIG. 18F illustrates another example of a mechanism that can be used to retain the shape of the wristband device in any number of different positions, including the positions shown in FIG. 18A.
Figure 18G:
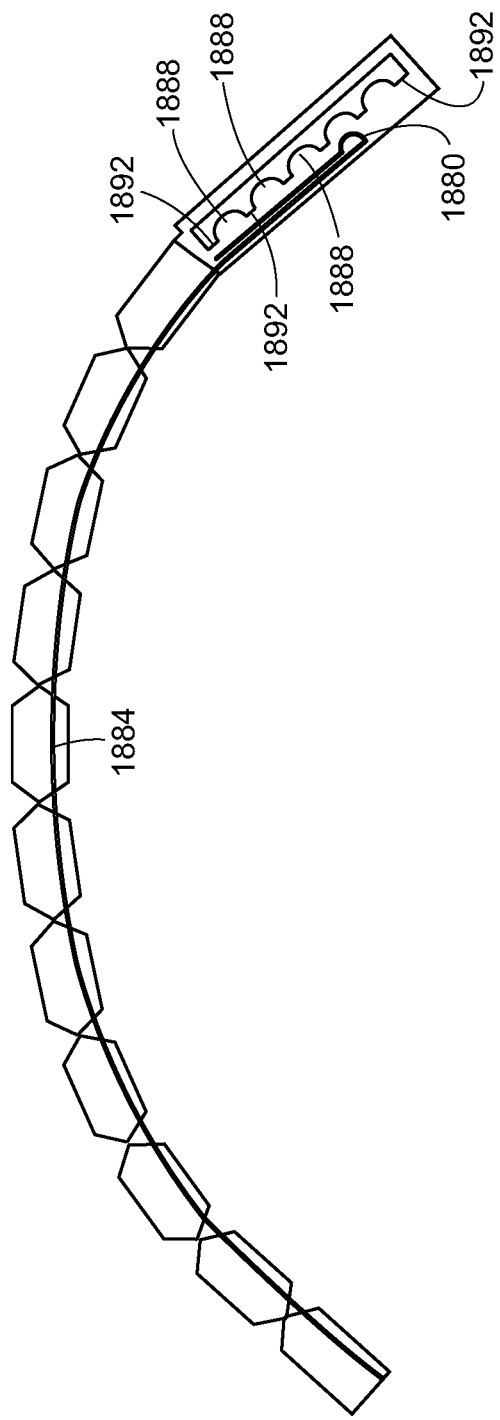
FIG. 18G illustrates another example of a mechanism that can be used to retain the shape of the wristband device in any number of different positions, including the positions shown in FIG. 18A.

In some examples, the article 10 can include a mechanism configured to retain the shape of the band 12 in any number of different positions (i.e., to lock or hold the shape of the band 12), e.g., the flat, curved, open cuff, or closed/overlapping positions illustrated in FIG. 18A. Such a mechanism can be applied to the whole of the band or portions thereof. As illustrated in FIGS. 18B-18G, such a mechanism can take any number of different forms. The mechanism can, as illustrated in FIG. 18B, include magnets 1790 (e.g., on the top and/or bottom of the article 10) that interact with one another to retain the shape of the band 12. The mechanism can, as illustrated in FIG. 18C, include pins 1800 that ride in slots 1804 having detents 1808 associated with various positions of the band 12; these detents 1808 can retain the pins 1800, and thus, the band 12, at the respective position. The mechanism can, as illustrated in FIG. 18D, include pins 1820 that ride in bi-stable detents 1824 (i.e., the detents have or define two positions) formed in each of the slots 1828 by a leaf-spring 1832. The mechanism can, as illustrated in FIG. 18E, take the form a plurality of pockets 1840 or other openings defined or formed on one end 1842 of each of the links and a boss 1844 or other projection, defined or formed on one end 1846 of each of the links. The pockets 1840 define or correspond to different positions, and thus different shapes, of the band 12, and are sized to receive and retain a respective one of the bosses 1844 (from an adjacent link) therein, as illustrated in FIG. 18E, so as to retain the band 12 in the desired position (i.e., desired shape). The mechanism can, as illustrated in FIG. 18F, take the form of a magnet 1860 coupled to (e.g., formed on) a layer 1864 (e.g., of sheet metal) of or integrated into the band 12 (e.g., at a position below the neutral plane) that interacts with one of a plurality of magnets 1868 arranged in the band 12 and defining or corresponding to different positions (and thus different shapes) of the band 12. While the magnet 1860 is coupled to the layer 1864 at or proximate to an end 1870 of the layer 1864, and the magnets 1868 are arranged proximate to an end 1872 of the 12, the magnet 1860 and/or the magnets 1868 can, in other examples, be positioned differently. The mechanism can, as illustrated in FIG. 18G, take the form of a projection 1880 coupled to (e.g., formed on) a layer 1884 (e.g., of sheet metal) of or integrated into the band 12 (e.g., at a position below the neutral plane) that is disposed and retained in one of a plurality of detents 1888, defined between adjacent ribs 1892 arranged in a portion of the band 12, defining or corresponding to different positions (and thus different shapes) of the band 12. While not illustrated herein, it is also envisioned that such a mechanism can take the form of one or more layers/components coupled (e.g., secured) to the underside, such as, for example, a thin flexible battery (e.g., a ceramic battery), that retains the shape they are placed in.

Accordingly, the band, and thus the display 18, can be locked in any number of different positions. For example, (i) the display 18 can be "locked" in an almost flat position and used/held like a phone by your face, (ii) the display 18 can be "locked" in a C shape around any wrist or even an overlap shape, which would allow for many wrist sizes, and rather than a clasp, there would be an "open" space or "overlap space" without the two ends actually being engaged, (iii) the display can be locked in other positions (e.g., to be put on a desk or other surface), or (iv) the display can be locked in any other position.

While the article 10 of FIGS. 1-18G is generally illustrated as having a flexible electronic display, other flexible electronic components, such as for example a flexible OLED light, a flexible electronic circuit, a sensor tag, a collapsible e-reader, a roll-out screen, a solar cell array, a sensor array, other type of flexible sheet or screen, or other flexible electronic component, could be used instead of a flexible electronic display. Further yet, while the article 10 of FIGS. 1-18G is generally illustrated as having some sort of connection mechanism or structure, the flexible electronic display or other type of flexible electronic component (e.g., the flexible OLED light) may or may not include such a connection mechanism or structure.

In a general sense, the flexible display 18 of any or all of the embodiments described herein may be manufactured as any type of flexible display, such as an e-paper display, an organic light emitting diode (OLED) display, etc. and this flexible display, once manufactured, may then be formed, curved or bent in various manners. Generally speaking, flexible display 18 may be made of two flexible substrates including a backplane flexible substrate and frontplane flexible substrate placed back to back, next to one another, or laminated onto each other. In the case of e-paper, an additional layer of material such as an adhesive may be included in the frontplane and disposed between the backplane and the frontplane. In some cases, such as with the use of active-matrix OLEDs, electrophoretic displays (EPDs), e-paper, electronic ink displays, e-reader displays, liquid-crystal displays (LCDs), or other active-matrix type displays, the backplane includes a plurality of semiconductor devices or elements, e.g., an array of transistors and/or other elements, disposed thereon for driving or providing energization to individual lighting, transmitting, or reflective elements disposed in a similar array on the frontplane or on top of the transistors and/or other elements. The semiconductor devices or elements may be formed on the backplane in any known or desired manner, such as by etching, dye cut forming, printing, sputtering, spin-coating, spray coating, other deposition or patterning techniques, or combinations thereof, etc. Likewise, the light emitting, transmitting, or reflective elements may be formed as any desired types of light emitting, transmitting, or reflective elements using these same or different techniques, and the elements may include light emitting diodes (LEDs), OLEDs, e-paper, liquid crystal, etc. In the case of e-paper, for example, the frontplane and the backplane may be formed with black and white, oppositely charged particles suspended in a clear fluid which, when put in an electric field, will cause the black or the white particles to drift to the top of the display to create a white state, a black state, or an intermediate grey state. In any case, the substrate of the backplane and the frontplane may be formed of the same material or of a different flexible material, such as plastic or flexible glass, and these materials may have the same or different flexibility properties, as long as both materials are able to flex to the curvature needed for bending the electronic display 18.

More particularly, the flexible displays illustrated herein, may be manufactured as a flexible display, such as an e-paper display, an organic light emitting diode (OLED) display, etc. Generally speaking, the flexible displays may be constructed on two flexible substrates, or may be constructed on one flexible substrate but having at least two flexible substrates. The flexible substrates may include a backplane display area and frontplane display area placed back to back, next to one another, or laminated onto each other. The frontplane display area comprises an array of optic elements (e.g., electro-optic elements) provided on a first flexible substrate that are capable of displaying an image, while the backplane display area comprises an array of semiconductor devices or elements (e.g., transistor elements) provided on a second flexible substrate for driving or providing energization to the optic elements on the frontplane. Materials suitable for use as the flexible substrate for either the frontplane and/or the backplane include, but are not limited to, various plastic substrates such as polyimide, polyethylene terephthalate (PET), polycarbonate, polyethersulfone, polyether ether ketone (PEEK), and polyethylene naphthalate (PEN). Metallic foils or flexible glass also may be used.

Preferably, the backplane display area comprises an array of thin film transistors (TFTs) provided on a flexible, plastic substrate such as PET. The TFT array may include switching and/or driving TFTs, and additional elements such as storage capacitors, and interconnect wiring. An individual TFT element generally is made by successive deposition and patterning of conductor (i.e., source, drain, and gate electrodes), insulator (i.e., dielectric) and semiconductor thin film layers. The active semiconductor layer can be composed of either organic (small-molecule or polymeric semiconductors) or inorganic materials (such as amorphous silicon, low-temperature polycrystalline silicon, graphene, carbon nanotube, and metal oxide semiconductors).

The TFT array may preferably comprise organic TFTs (OTFTs) based upon an organic semiconductor described in at least one of U.S. Pat. Nos. 6,585,914; 6,608,323; 6,991,749; 7,374,702; 7,528,176; 7,569,693; 7,605,225; 7,671,202; 7,816,480; 7,842,198; 7,892,454; 7,893,265; 7,902,363; 7,947,837; 7,982,039; 8,022,214; 8,329,855; 8,404,844; 8,440,828; U.S. Patent Publication No. 2010/0252112; U.S. Patent Publication No. 2010/0283047; U.S. Patent Publication No. 2010/0326527; U.S. Patent Publication No. 2011/0120558; U.S. Patent Publication No. 2011/0136333; and U.S. Patent Publication No. 2013/0062598, the disclosure of each of which is incorporated by reference herein in its entirety for all purposes. While OTFTs may include metallic contacts and a dielectric layer composed of silicon oxide ($SiO_2$) or another inorganic oxide or nitride (such as $Al_2O_3$, $HfO_2$, $SiO_2$, or $Si_3N_4$), a dielectric layer composed of an electrically insulating polymer may be preferred. Exemplary polymeric dielectric materials include polyacrylates, polyimides, polyvinyl alcohol, polystyrene, polyester, polycarbonate, polyhaloethylene, epoxy resins, siloxane polymers, benzocyclobutene-based polymers. Other polymeric dielectrics are described in U.S. Pat. Nos. 7,605,394; 7,981,989; 8,093,588; 8,274,075; 8,338,555; U.S. Patent Publication No. 2011/0175089; U.S. Patent Publication No. 2011/0215334; and U.S. Patent Publication No. 2012/0068314. Conductive polymers such as poly(3,4-ethylenedioxythiophene) poly(styrenesulfonate) (PEDOT:PSS) may be used as alternative materials for metallic contacts in OTFTs.

Preferably, the TFT array may comprise metal oxide TFTs based upon a metal oxide semiconductor. For example, the metal oxide semiconductor can be selected from various mixed oxides including one or more of indium, zinc, tin, and gallium such as indium zinc oxide (IZO), zinc tin oxide (ZTO), indium gallium oxide (IGO), and indium gallium zinc oxide (IGZO). In a more preferred embodiment, the TFT array may comprise IGZO TFTs. While state-of-the art IGZO TFTs usually include thick layers of inorganic materials such as $SiO_2$, $SiO_x$, $Si_3N_4$, and $SiO_xN_y$ as dielectric and passivation layers, it is preferred that if the TFT array backplane comprises metal oxide TFTs, organic materials are used in at least some of the dielectric and passivation layers, such that the thickness of the remaining inorganic layer(s) may be reduced to allow maximum flexibility of the TFT array as whole. Metal oxide TFTs incorporating one or more organic layers are described in U.S. Pat. Nos. 8,017,458; 8,097,877; 8,395,150; and U.S. Patent Publication No. 2012/0223314, the disclosure of each of which is incorporated by reference herein in its entirety for all purposes.

In some scenarios, such as for an electrophoretic or e-reader display, the frontplane display area may be laminated, sealed to, or otherwise secured onto the backplane display area. The frontplane display area may be produced by forming a subassembly that comprises, in sequence, a flexible substrate, a conductive electrode layer, an electro-optic layer, and optionally, an adhesive layer to allow lamination to the backplane. In the case of an OLED display, the electro-optic layer is sandwiched between two electrode layers and is typically built on the TFT array. Generally, at least one of the two electrode layers is transparent, often composed of a transparent conductive oxide such as indium tin oxide (ITO). The electro-optic layer is composed of an organic material capable of emitting light when a voltage is applied across the two electrode layers. The organic light-emitting material may have a stacked structure including a plurality of different organic layers. In addition to one or more emissive layers, the stacked structure may include additional layers such as a hole-injection layer, a hole-transport layer, an electron-transport layer, a hole-blocking layer, and/or an electron-blocking layer to enhance device performance. Individual OLED elements may have different emitters (for example, a red emitter, a green emitter, or a blue emitter) in their emissive layer to provide a colored image. Exemplary OLED device structures and materials are described in U.S. Pat. Nos. 5,707,745, 5,844,363, 6,097,147, 6,303,238, and 8,334,545, the disclosure of each of which is incorporated by reference herein in its entirety for all purposes.

In the case of an e-paper display, the electro-optic layer may be composed of an encapsulated electrophoretic medium. The encapsulated electrophoretic medium generally comprises numerous small capsules, each of which itself comprises an internal phase containing electrophoretically-mobile (e.g., black and/or white) particles suspended in a liquid suspending medium, and a capsule wall surrounding the internal phase. Typically, the capsules are themselves held within a polymeric binder to form a coherent layer positioned between two electrode layers. Most commonly, one electrode layer has the form of a single continuous electrode, while the other electrode layer is patterned into a matrix of pixel electrodes, each of which defines one pixel of the display. Electronic charges are applied to the capsules to bring particles of a selected color to the surface. Electrophoretic media and related display device structures are described in, for example, U.S. Pat. Nos. 5,930,026; 6,831,769; 6,839,158; and 7,170,670, the disclosure of each of which is incorporated by reference herein in its entirety for all purposes. In addition to electrophoretic displays, other e-paper display technologies include electrowetting displays, and electrofluidic displays as described in, for example, U.S. Pat. Nos. 7,446,945 and 8,111,465, the disclosure of each of which is incorporated by reference herein in its entirety for all purposes.

To integrate the TFT array backplane with the frontplane for a completed display system, the bottom or pixel electrode of the frontplane is (connected) to the drain or source electrode of the switching TFT in an e-paper display, and the driving TFT in an active matrix OLED (AMOLED) display.

Various organic layers on either the frontplane and/or the backplane may be formed on the flexible substrate by solution-phase deposition techniques such as spin-coating, slot coating, die coating, printing (e.g., inkjet printing, screen printing, pad printing, offset printing, gravure printing, flexographic printing, lithographic printing, mass-printing and the like), spray coating, electrospray coating, drop casting, dip coating, and blade coating. Inorganic (e.g., metallic or metal oxide) layers usually are deposited by physical or chemical vapor deposition methods (e.g., sputtering), but may be solution-processed if a soluble precursor is available. The layers may be patterned into specific elements by photolithography, either by use of the intrinsic photosensitivity of the layers (e.g., certain polymeric layers) or by use of a photoresist (e.g., metallic, metal oxide, or small-molecule organic layers).

The following additional considerations apply to the foregoing discussion. Throughout this specification, plural instances may implement components, operations, or structures described as a single instance. Although individual operations of one or more routines or methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter of the present disclosure.

Additionally, certain embodiments are described herein as including logic or a number of components, modules, or mechanisms or units. Modules and units may constitute either software modules (e.g., code stored on a non-transitory machine-readable medium) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

A hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also include programmable logic or circuitry (e.g., as encompassed within a general-purpose processor or other programmable processor) that is temporarily configured by software to perform certain operations. It will be appreciated that the decision to implement a hardware module in dedicated and permanently configured circuitry or in temporarily configured circuitry (e.g., configured by software) may be driven by cost and time considerations.

Accordingly, the hardware terms used herein should be understood to encompass tangible entities, be that entities that are physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware and software modules can provide information to, and receive information from, other hardware and/or software modules. Accordingly, the described hardware modules may be regarded as being communicatively coupled. Where multiple of such hardware or software modules exist contemporaneously, communications may be achieved through signal transmission (e.g., over appropriate circuits, lines and buses) that connect the hardware or software modules. In embodiments in which multiple hardware modules or software are configured or instantiated at different times, communications between such hardware or software modules may be achieved, for example, through the storage and retrieval of information in memory structures to which the multiple hardware or software modules have access. For example, one hardware or software module may perform an operation and store the output of that operation in a memory device to which it is communicatively coupled. A further hardware or software module may then, at a later time, access the memory device to retrieve and process the stored output. Hardware and software modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, include processor-implemented modules.

Similarly, the methods or routines described herein may be at least partially processor-implemented. For example, at least some of the operations of a method may be performed by one or processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "application," an "algorithm" or a "routine" is a self-consistent sequence of operations or similar processing leading to a desired result. In this context, applications, algorithms, routines and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" is employed to describe elements and components of the embodiments herein. This is done merely for convenience and to give a general sense of the description. This description should be read to include one or at least one and the singular also includes the plural unless it is obvious that it is meant otherwise.

Upon reading this disclosure, those of skill in the art will appreciate still additional alternative structural and functional designs for implementing display features via a flexible electronic display on a dynamically flexible, attachable article as disclosed herein. Thus, while particular embodiments and applications have been illustrated and described herein, it is to be understood that the disclosed embodiments are not limited to the precise construction and components disclosed herein. Various modifications, changes and variations, which will be apparent to those skilled in the art, may be made in the arrangement, operation and details of the methods and structure disclosed herein without departing from the spirit and scope defined in the claims.

The invention claimed is:

1. An attachable article, comprising:
a band having a flexible support and first and second ends;
a flexible electronic component disposed on the flexible support;
a connection mechanism disposed proximate to one or both of the first and second ends of the band to connect two different portions of the article together,
wherein the attachable article is dynamically flexible; and
a mechanism configured to retain a shape of the band when the band is bent,
wherein the flexible support comprises a plurality of links pivotably coupled to one another, each of the plurality of links having a first end having an inward curve and a second end opposite the first end and having an outward curve that is curved in a complementary manner with an inward curve of another adjacent link, and wherein each of the plurality of links comprises at least one first component arranged proximate to the first end and at least one second component arranged proximate to the second end, the at least one first component configured to interact with the at least one second component of a respective second link disposed adjacent the first end, and the at least one second component configured to interact with the at least one first component of a respective third link disposed adjacent the second end, such that the first and second components retain the shape of the band when the band is bent, and
wherein the connection mechanism comprises:
at least one magnet disposed in proximity to each of the first and second ends, the magnets configured to react with one another; and
a mechanical connection structure, and
wherein the mechanism comprises a pin coupled to each of the plurality of links and a slot formed in a middle portion of the each of the plurality of links, the pin of each first link being movably disposed within the slot of a respective second link, each of the slots having a plurality of detents corresponding to a plurality of different bending positions of the band and configured to prevent further movement of the pins, respectively, when the band reaches a desired one of the plurality of different bending positions.

2. The attachable article of claim 1, wherein at least one magnet is disposed on each of the first and second ends.

3. The attachable article of claim 1,
wherein the mechanical connection structure comprises a tab formed on one of the first and second ends and a latch formed at or proximate to the other of the first and second ends, the latch configured to releasably retain the tab to mechanically connect the first and second ends to one another.

4. The attachable article of claim 3, wherein at least one magnet is disposed on each of the first and second ends.

5. The attachable article of claim 3, wherein the latch defines a slot, the tab being releasably insertable into the slot.

6. The attachable article of claim 3, wherein the latch comprises a pair of arms that define a slot, the tab being releasably insertable into the slot.

7. The attachable article of claim 2, wherein the mechanical connection structure comprises a slot formed in the other of the first and second ends, the tab being releasably insertable into the slot.

8. The attachable article of claim 5, wherein the latch is biased, via one or more biasing elements, to retain the tab in the slot.

9. An attachable article, comprising:
a band having a flexible support and first and second ends;
a flexible electronic component disposed on the flexible support;
a connection mechanism disposed proximate to one or both of the first and second ends of the band to connect two different portions of the article together,
wherein the attachable article is dynamically flexible; and
a mechanism configured to retain a shape of the band when the band is bent,
wherein the flexible support comprises a plurality of links pivotably coupled to one another, each of the plurality of links having a first end having an inward curve and a second end opposite the first end having an outward curve that is curved in a complementary manner with an inward curve of another adjacent link, and wherein each of the plurality of links comprises at least one first component arranged proximate to the first end and at least one second component arranged proximate to the second end, the at least one first component configured to interact with the at least one second component of a respective second link disposed adjacent the first end, and the at least one second component configured to interact with the at least one first component of a respective third link disposed adjacent the second end, such that the first and second components retain the shape of the band when the band is bent, and
wherein the mechanism comprises a pin coupled to each of the plurality of links and a slot formed in a middle portion of each of the plurality of links, the pin of each first link being movably disposed within the slot of a respective second link, each of the slots having a plurality of detents corresponding to a plurality of different bending positions of the band and configured to prevent further movement of the pins, respectively, when the band reaches a desired one of the plurality of different bending positions.

10. The attachable article of claim 9, wherein the plurality of detents of each slot are only arranged on one inner surface of the respective slot.

11. The attachable article of claim 9, wherein the connection mechanism comprises at least one magnet disposed in proximity to each of the first and second ends, the magnets configured to react with one another.

12. The attachable article of claim 11, wherein at least one magnet is disposed on each of the first and second ends.

13. The attachable article of claim 9, wherein the connection mechanism further comprises a mechanical connection structure.

14. The attachable article of claim 13, wherein the mechanical connection structure comprises a slot formed in the other of the first and second ends, the tab being releasably insertable into the slot.

15. The attachable article of claim 13, wherein the mechanical connection structure comprises a buckle clasp connected to the first end or the second end.

* * * * *